(12) United States Patent
Brumer et al.

(10) Patent No.: US 6,548,124 B1
(45) Date of Patent: Apr. 15, 2003

(54) NANOMETRIC SCALE COHERENTLY CONTROLLED MOLECULAR DEPOSITION

(75) Inventors: Paul Brumer, 136 Fisherville Road, Toronto (CA); Bijoy Dey, Kumarpur (IN); Moshe Shapiro, Rehovot (IL)

(73) Assignees: Paul Brumer, Toronto (CA); Yeda Research & Development Co. Ltd., Rehovot (IL)

( * ) Notice: Subject to any disclaimer, the term of this patent is extended or adjusted under 35 U.S.C. 154(b) by 0 days.

(21) Appl. No.: 09/531,036

(22) Filed: Mar. 20, 2000

(51) Int. Cl.[7] .................................................. C23C 8/00
(52) U.S. Cl. .................... 427/586; 427/248.1; 427/272; 427/596; 427/598
(58) Field of Search ................................ 427/596, 598, 427/248.1, 272, 282, 586

(56) References Cited

U.S. PATENT DOCUMENTS

| | | | |
|---|---|---|---|
| 4,024,396 A | * 5/1977 | Hill et al. | 250/338 |
| 4,386,274 A | * 5/1983 | Altshuler | 250/251 |
| 5,256,849 A | 10/1993 | Scully | 219/121.68 |
| 5,360,764 A | 11/1994 | Celotta et al. | 437/173 |
| 6,183,817 B1 | * 2/2001 | Gersonde | 250/251 |

OTHER PUBLICATIONS

K.K. Berggren et al., "Calculation of Atomic Positions in Nanometer–Scale Direct–Write Optical Lithography with an Optical Standing Wave", *Journal of the Optical Society of America B*, 11(7), Jul. 1994, pp. 1166–1176.

H. Stapelfeldt et al., "Deflection of Neutral Molecules Using a Nonresonant Dipole Force", *Physical Review Letters* 79(15), Oct. 13, 1997, pp. 2787–2790.

C. Asaro, "Polarization Control of Branching Ratios in Photodissociation", *Physical Review Letters*, 60(16), Apr. 18, 1988, pp. 1634–1637.

A. Abrashkevich et al., "Coherent Control of Reactive Scattering", *Physical Review Letters* 81(17), Oct. 26, 1998, pp. 3789–3792.

P. Brumer et al., "Control of Unimolecular Reactions using Coherent Light", *Chem. Phys. Letters* 126(6), May 23, 1986, p. 541.

E. McCullough et al., "Coherent Control of Refractive Indices", *Physical Review A* 61, 2000, pp. 1–4. (No month avail.).

J.J. McClelland et al., "Laser–Focused Atomic Deposition", *Science*, vol. 262, Nov. 5, 1993, pp. 877–880.

A. Vardi et al., "Complete Population Transfer to and from a Continuum and the Radiative Association of Cold Na Atoms to Produce Translationally Cold $Na_2$ Molecules in Specific Vib–Rotational States", *Optics Express* 4(2), Jan. 18, 1999, pp. 91–106.

M. Shapiro et al., "Coherent Control of Collisional Events: Bimolecular Reactive Scattering", *Physical Review Letters* 77(12), Sep. 16, 1996, pp. 2574–2576.

(List continued on next page.)

*Primary Examiner*—Bernard Pianalto
(74) *Attorney, Agent, or Firm*—Ladas & Parry

(57) ABSTRACT

A method for the controlled nanometer-scale deposition of molecules on a surface, by means of coherently controlled optical focusing. The coherent control is conveniently performed by inducing a linear superposition of molecular bound states, by means of electromagnetic fields supplied by an applied laser beam. The optical focusing is conveniently performed by passing a beam of such suitably prepared molecules through another electromagnetic field supplied by a standing wave induced by two interacting laser beams. Altering the characteristics of the laser beams alters the forces operating on the molecules, thus directing them to the desired position on the surface. Selection of the frequencies, intensities, and relative phases of the electromagnetic fields, as well as the geometry of the interaction between the molecular beam and the electromagnetic fields, enables deposition of aperiodic molecular patterns on the surface with a resolution of 10 to 15 nanometers. Such nanoscale focusing of molecules by coherent light can be used for executing nanometric molecular lithographic processes.

23 Claims, 15 Drawing Sheets

OTHER PUBLICATIONS

D. Holmes et al., "Coherent Control of Bimolecular Collisions: Collinear Reactive Scattering", *J. Chem. Phys.* 105(20), Nov. 22, 1996, pp. 9162–9166.

U. Drodofsky et al., "Atom Lithography Using Light Forces", *Microelectronic Eng* 30, 1996, pp. 383–386. (No month avail.).

Sakai H et al., "Optical Deflection of Molecules" Physical Review A (Atomic, Molecular and Optical Physics), Apr. 1998, APS Through AIP, USA, vol. 57, No. 4, pp. 2794–2801.

Lison F et al., "Nanoscale Atomic Lithography with a Cesium Atom Beam", Applied Physics B: Lasers and Optics, Springer International, Berlin, De, vol. B65, No. 3, Sep. 1, 1997, pp. 419–421.

Bell A S et al., "Atomic Lithography", Microelectronic Engineering, Elsevier Publishers BV., Amsterdam, NL, vol. 41–42, Mar. 1, 1998, pp. 587–590.

Dey B K et al., "Coherently Controlled Nanoscale Molecular Deposition", Physical Review Letters, Oct. 9, 2000, APS, USA, vol. 85, No. 15, pp. 3125–3128.

\* cited by examiner

US 6,548,124 B1

NANOMETRIC SCALE COHERENTLY CONTROLLED MOLECULAR DEPOSITION

FIELD OF THE INVENTION

The present invention relates to the field of the controlled deposition of molecules on surfaces on a nanometric scale.

BACKGROUND OF THE INVENTION

The optical manipulation of the atoms constituting an atomic beam has been widely studied over the past few years. It has been shown, for instance in the article "Calculation of Atomic Positions in Nanometer-scale Direct-write Optical Lithography with an Optical Standing Wave", by K. K. Berggren et al., published in Journal of the Optical Society of America B, Vol. 11, pp. 1166–1176 (1994), and in the references thereto, that an atomic beam can be focused to sub-micron scale dimensions by using the dipole forces exerted on the atoms by an electromagnetic field, such as that present in a standing light wave. One possible application of this phenomenon is in direct-write atomic nanolithography, which offers the possibility of microfabrication applications in the microelectronic industry, at resolutions well below the wavelength of ultra-violet light, as currently used.

In U.S. Pat. No. 5,360,764 to R. J. Celotta and J. J. McClelland, hereby incorporated by reference, there is described the use of a combination of laser cooling techniques and periodic standing wave electromagnetic fields to enable the focusing of atoms and their subsequent deposition on a substrate, on a nanometric scale. However, the technique described therein has a number of disadvantages; (i) it is limited to the controlled deposition of atoms, and there are many practical chemical processes, where the presence of molecules rather than atoms is preferable (ii) it requires extensive laser cooling to narrow the lines sufficiently to provide focusing with good resolution, and (iii) it is limited to the formation of periodic structures on the surface. The technique is thus both limited in the type of materials that can be deposited to atomic species, and also in the range of positions capable of deposition. Furthermore, because of the transverse laser cooling required to provide good collimation of the beam in the longitudinal direction, the process is not simple to apply, involving the use of frequency shifted optical pumping and trapping laser beams.

A method of depositing molecules is also described in the Celotta et al. patent, whereby more than one atomic species are concurrently evaporated onto the desired substrate surface. One of the atomic species is focused into the desired pattern on the substrate by selecting the conditions to ensure that it is in resonance with the applied laser field, and the other, or others, are applied uniformly. At the positions of focus, the two atomic species react chemically to form the desired molecular deposit. Using this scheme, a method for the formation of an array of spots of $CrO_2$ is described therein. It is evident that this method for the deposition of molecules is complicated to perform, and it may prove difficult to achieve good stoichiometry.

Methods of direct manipulation of the molecules of a molecular beam by means of optical focusing, analogous to the methods described above of atomic beam manipulation, have not yet proved particularly successful. The concepts associated with molecular manipulation have indeed been considered for several years, such as is described, for instance, in the article entitled "Deflection of Neutral Molecules Using a Nonresonant Dipole Force" by H. Stapelfeldt et al., published in Physical Review Letters, Vol. 79, pp.2787–2788, 1997, and in the earlier references cited therein. The comparative lack of success is due, in large part, to the fact that the optical cooling and trapping techniques developed for atoms are not readily applicable to molecules. There therefore exists an important need for a method for the controlled deposition of molecules on surfaces on a nanometric scale.

The disclosures of the each of the publications mentioned in this section, and of those in the other sections of this specification, are hereby incorporated by reference, each in its entirety.

SUMMARY OF THE INVENTION

The present invention seeks to provide a new method and apparatus for the optical focusing of molecular beams, such that the molecules can be deposited in aperiodic structures, with resolutions of down to 10–15 nanometers. The ability to deposit molecules on surfaces at a nanometric scale has important applications in the semiconductor industry for the purposes of direct deposition etching and for other lithographic processes. The method requires the use only of mechanical cooling, such as is provided by expansion of the molecular beam through a supersonic nozzle, thereby considerably simplifying the process in comparison with the optical collimation processes needed for use in atomic beam focusing. The nature of the pattern formed, including the position and width of the component parts of the pattern, are altered by varying a number of parameters associated with the beam preparation and with the electromagnetic fields to which the beam is subjected.

A beam of molecules, aimed at the surface on which the deposition is required, is sent through a skimmer to minimize velocity components perpendicular to the direction of the beam. It is then subjected to an electromagnetic field such as may be provided by one or more laser beams, either pulsed or CW, which prepares a linear superposition of bound states, primarily through a two photon absorption process. This operation is another application of the process of coherent control, which has been developed recently to affect atomic and molecular processes by means of quantum interference. Up to now, coherent control has been used to control the outcome of unimolecular processes such as photodissociation, and more recently, collisional and scattering processes. Details of the theory and some applications of the technique of coherent control are contained in the articles "Polarization Control of Branching Ratios in Photodissociation" by C. Asaro, P. Brumer and M. Shapiro, published in Physical Review Letters, Vol. 60, pp. 1634–1637 (1988) and in "Coherent Control of Reactive Scattering" by A. Abrashkevich, M. Shapiro and P. Brumer, published in Physical Review Letters, Vol. 81, pp. 3789–3792 (1998), and in the many references cited therein.

In U.S. Pat. No. 5,256,849, to M. O. Scully, there is described a method of increasing the refractive index of a material by means of the creation of superpositions of states therein, by means of coherent control of the atomic levels of the material. Alteration of the refractive index of a material is operative to affect the motion of light through the material. The use of coherent control in the present invention, unlike any of the methods described in the prior art, is operative to affect the motion of the molecules themselves, by means of optical focusing.

The prepared molecular beam then passes through two or more standing electromagnetic fields directed parallel to the surface, which too may be produced by means of interacting laser beams. By varying the characteristics of the laser beams, the molecular properties, the distance of the stationary fields from the surface, and the properties of the stationary electromagnetic fields, the nature of the pattern deposited on the surface can be controlled, including the position, intensity and resolution of the component parts of the pattern. In general, the pattern displays a large background with several relatively low intense peaks when there is no molecular coherence, whereas the peaks become intense and the background weak when the molecular coherence is introduced. The position of the peaks is controlled primarily by the optical coherence, whereas, the peak intensity is controlled by the molecular coherence of the beam.

There is thus provided in accordance with a preferred embodiment of the present invention, a method of depositing molecules in a predetermined pattern onto a surface by means of coherently controlled optical focusing of a beam of the molecules.

There is further provided in accordance with yet another preferred embodiment of the present invention, a method as described above and consisting of the steps of providing a collimated beam of molecules to be deposited, directing the beam through a first electromagnetic field, typically produced by a laser beam, operative to produce a superposition of bound states of the molecules, and thereafter directing the beam through a second electromagnetic field, typically produced by two or more standing waves, such that the molecules are focused onto the surface in the predetermined pattern.

In accordance with still another preferred embodiment of the present invention, there is provided a method as described above and also consisting of the step of cooling the beam of molecules before production of the superposition of bound states, the cooling being optionally effected by either a mechanical or a laser cooling process.

There is further provided in accordance with still another preferred embodiment of the present invention, a method as described above and wherein the superposition of bound states of the molecules is formed by means of a two-photon absorption process.

In accordance with a further preferred embodiment of the present invention, there is also provided a method as described above and wherein the mechanical cooling process is effected by expansion of the beam through a supersonic nozzle.

There is provided in accordance with yet a further preferred embodiment of the present invention, a method and wherein the first laser is either a CW or a pulsed laser.

There is even further provided in accordance with a preferred embodiment of the present invention, a method as described above and wherein the standing waves are formed by one or more laser beams.

Furthermore, in accordance with yet another preferred embodiment of the present invention, there is provided a method as described above and wherein the predetermined pattern is aperiodic and may be determined at least by the parameters of the first electromagnetic field and by the parameters of the second electromagnetic field.

There is also provided in accordance with a further preferred embodiment of the present invention, a method as described above and also consisting of the step of directing the beam through a third electromagnetic field, arranged approximately orthogonally to the second electromagnetic field, and in effectively the same common plane, such that the molecules are focused onto the surface in a predetermined array pattern, which could have a resolution of less than 50 nanometers.

In accordance with yet another preferred embodiment of the present invention, there is provided a method of depositing molecules in a predetermined pattern onto a surface as described above, and wherein the molecules are operative to perform applications such as nanolithography, microetching, the writing of information on a storage medium, the formation of photolithographic masks, the production of doped regions within the surface, the production of high profile tip structures on the surface, or the production of optical grating structures on the surface.

There is further provided in accordance with yet another preferred embodiment of the present invention, a system for the deposition of molecules in a predetermined pattern onto a surface by means of coherently controlled optical focusing of a beam of the molecules.

In accordance with still another preferred embodiment of the present invention, there is provided a system for the deposition of molecules as described above, and consisting of a source emitting a beam of the molecules, a collimator for minimizing the transverse velocity components of the molecules of the beam, a first electromagnetic field through which the beam is directed, operative to produce a superposition of bound states of the molecules, and a second electromagnetic field, through which the beam is thereafter directed, such that the molecules are focused onto the surface in the predetermined pattern.

There is further provided in accordance with still another preferred embodiment of the present invention, a system for the deposition of molecules as described above and also consisting of a cooler for cooling the beam of molecules before production of the superposition of bound states, the cooler utilizing a mechanical cooling process or a laser cooling process.

In accordance with a further preferred embodiment of the present invention, there is also provided a system for the deposition of molecules as described above, and wherein the mechanical cooling process consists of the expansion of the beam through a supersonic nozzle.

There is provided in accordance with yet a further preferred embodiment of the present invention, a system for the deposition of molecules as described above and wherein the first electromagnetic field is formed by at least one first laser beam.

There is even further provided in accordance with a preferred embodiment of the present invention, a system for the deposition of molecules as described above and wherein the second electromagnetic field consists of at least two standing waves formed by laser beams.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
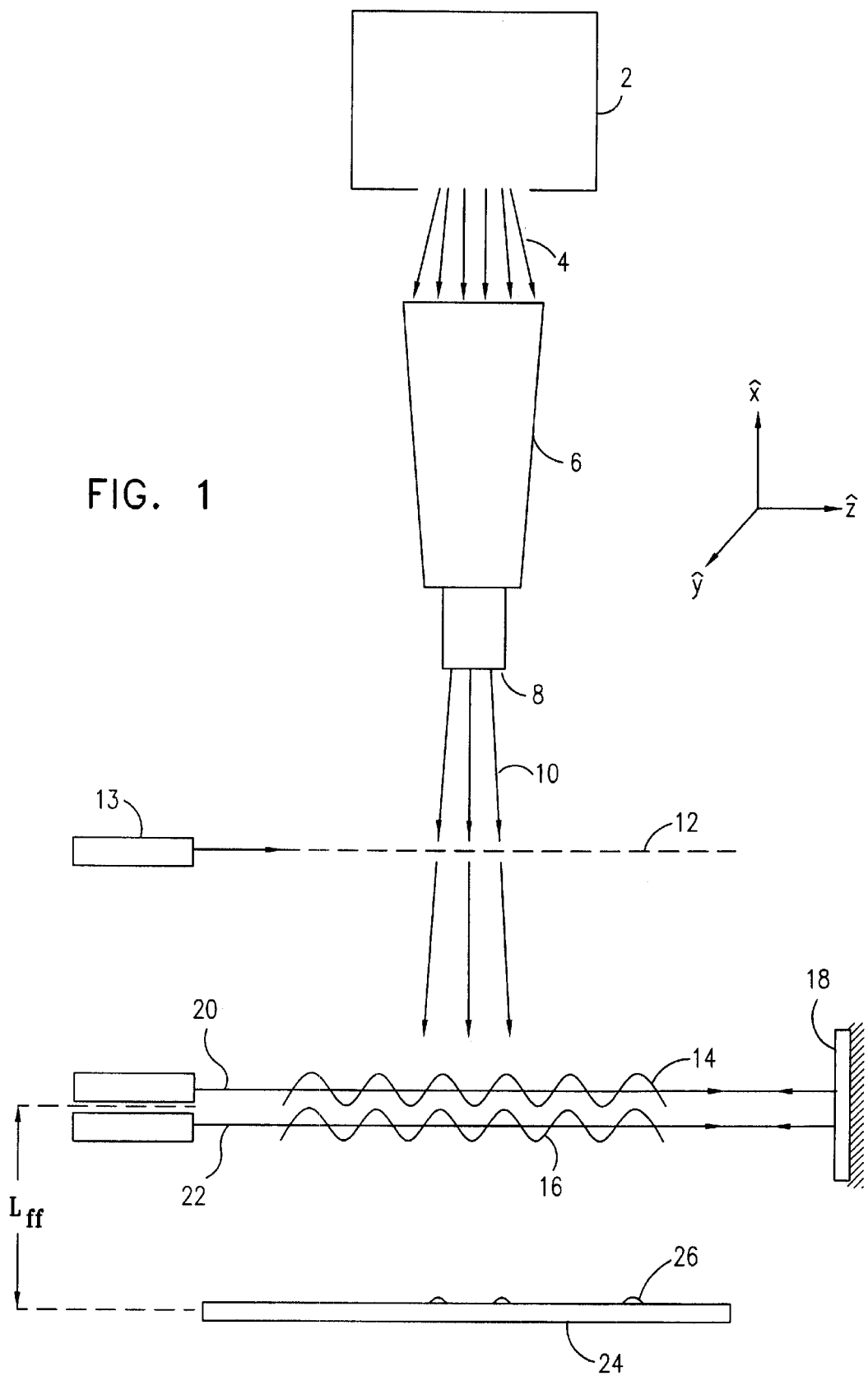
FIG. 1 is a schematic representation of a system for performing coherently controlled molecular beam optical focusing, such as is suitable for executing nanolithography, according to a preferred embodiment of the present invention.

Reference is now made to FIG. 1, which schematically illustrates a preferred embodiment of an apparatus for the execution of coherently controlled molecular beam optical focusing, such as is suitable for the performance of nanolithography. The molecular source 2 produces a beam 4, which is cooled preferably by thermal expansion through a supersonic nozzle 6, such as is well known in the art. The beam may then be further collimated mechanically by an exit aperture 8, to minimize the transverse velocity spread. The molecules are preferably cooled to a single rotational state. Alternatively and preferably, the molecules may be laser cooled, but that method is significantly more complicated to perform. The collimated beam 10 propagates along the x direction and then passes through a preparatory electromagnetic field 12 which produces a linear superposition of bound states of the molecules. The electromagnetic field is preferably produced by means of a laser 13.

The beam then preferably passes through two standing waves (SW) 14, 16 of a radiation field, preferably formed by retro-reflecting off a mirror 18, two near resonant, CW laser beams 20, 22, positioned above the substrate 24 onto which the molecules are to be deposited. While passing through the SW radiation field, the molecules experience a dipole force, due to the SW-induced optical potential (OP), which acts as an array of lenses, causing those molecules in the beam with kinetic energy less than the depth of the OP to focus into predefined patterns 26 as they deposit onto the substrate 24. Those molecules with kinetic energy greater than the depth of the OP skip over the potential well and are lost to the ordered deposition process.

According to a preferred method of embodiment of the present invention, the kinetic energy of the beam in the x-direction $v_\parallel$ is approximately fixed and is much larger than the magnitude of the OP, such that a majority of the molecules are indeed focused as desired. In the y-direction, perpendicular to the direction of the two SW's, the focusing region is essentially uniform. The focusing effect is then described by an effective one dimensional OP along the z-direction. The molecules in the beam execute motion according to the Hamilton's equation:

$$m_{N_2}\dot{z}_i = p_i \quad (1)$$

and $$p_i = \frac{d}{dz}V_{op|zi,pi} \quad (2)$$

where $V_{op}$ is the optical potential and the subscript i symbolizes the i-th molecule in the beam, treated as a point-like particle. The result of focusing by means of a one-dimensional OP along the z-direction is a pattern of lines of deposited molecules, of essentially uniform intensity in the y-direction, the lines being spaced in the z-direction and of width and intensity in accordance with the deposition parameters used.

According to another preferred embodiment of the present invention, it is possible to deposit an array of spots rather than an array of lines, by adding another electromagnetic field, preferably produced by another pair of laser beam standing waves, preferably directed orthogonally to the first pair of SW's and in the same plane thereto. The second electromagnetic wave then produces an additional OP directed along the y-direction, thus focusing the molecular beam in this direction also. The result of this preferred embodiment is therefore an array of deposited spots, in positions and of intensity according to the parameters chosen.

One preferred application is the direct deposition of hydrogen chloride or chlorine molecules on the surface of a microelectronic substrate for purposes of direct write etching. Another application is in the direct writing of nanometer scale information for high density information storage. Other preferred applications in the semiconductor industry include the production of nanometric scale photolithographic masks for subsequent conventional etching, the production of such masks for plasma etching, the doping of selected areas of a wafer on a nanometric scale for the production of high resolution structures, the deposition of high profile tip structures such as are used in field emission devices, and the generation of high resolution shaped optical grating structures. It should be emphasized that unlike the methods available in the prior art, since the present invention enables the deposition of complete molecules, the stoichiometry of the deposited layers or structures can be more readily maintained.

In order to produce the desired deposition distribution on the substrate, the optical coherence of the ordering and focusing laser beams, the molecular coherence, and the molecular beam itself must be arranged such that the optical potential interacts with the beam to direct the molecules to their correct positions. Methods of calculation are now presented, according to preferred embodiments of the present invention, to illustrate how these necessary parameters are derived to ensure the desired nature and extent of the focusing effect. As an example, the focusing of a mono-energetic Gaussian thermal beam of nitrogen molecules $N_2$ is described.

As a first step, the molecular coherence is calculated. It is assumed that the molecular beam passes through a preparatory laser field to produce a superposition state composed of two Hamiltonian eigenstates; an extension to a superposition state involving more than two eigenstates is also possible. The superposition state is given by:

$$|\psi(t)\rangle = c_1|\phi_1\rangle e^{-iE_1 t/\hbar} + c_2|\phi_2\rangle e^{-iE_2 t/\hbar} \quad (3)$$

where $|\phi_i\rangle$ represents the Hamiltonian eigenstates of energy $E_i$. This coherent state is prepared by two-photon absorption using a laser of frequency $\omega_L$ and amplitude $E_L$. Application of perturbation theory methods, such as is known in the art, leads to the evaluation of the population of the upper level as:

$$|c_2|^2 = \frac{|E_L|^4}{\hbar^4} \sum_{m,n} \frac{\mu_{1m}\mu_{m2}\mu_{2n}\mu_{n1}}{(\Omega_{m1}-\omega_L)(\Omega_{n1}-\omega_L)(\Delta_{2\omega L}-i\gamma)(\Delta_{2\omega L}+i\gamma)} \leq 0.2 \quad (4)$$

where $\Omega_{mn} = (E_m - E_n)/\hbar$ and $\Delta_{2\omega L} = \Omega_{21} - 2\omega_L \equiv (E_2 - E_1)/\hbar - 2\omega_L$ is the detuning of the two-photon absorption from resonance, and $\gamma$ is the linewidth of the transition between two superposition states where m and n represent the quantum numbers corresponding to the rotational, vibrational and electronic states. Note that within the perturbation regime $|c_2|^2 \leq 0.2$, which restricts the power of the pump laser. Assuming a negligible value of $\Delta_{2\omega L}$, a restriction on two parameters results, viz., $|c_2|^2$ and $\gamma$. Table I shows the value of the pump field $E_L$ required as a function of $\gamma$, for $|c_2|^2 = 0.2$. The pump laser is set at the frequency $\omega_L$ required for a resonant two-photon absorption process between the levels of the ground electronic state $|\phi_1\rangle = |v=0, J=0, M=0\rangle$ and $|\phi_2\rangle = |v=0, J=2, M=0\rangle$.

TABLE 1

| $\gamma$ (Hz) | $E_L$ (V/m) |
|---|---|
| $8.3 \times 10^6$ | $1.0 \times 10^7$ |
| $1.0 \times 10^9$ | $1.1 \times 10^8$ |

In this calculation of the optical potential are included the ground electronic state $X\Sigma_g^+$ and six electronic excited states viz., $b'^1\Sigma_u^+$, $c'^1\Sigma_u^+$, $e'^1\Sigma_u^+$, $b^1\Pi_u$, $c^1\Pi_u$ and $o^1\Pi_u$ whose transition dipole matrix elements between the ground and excited states are non-zero. Eigenstates involved in the superposition are taken to be in the $X\Sigma_g^+$ state. Defining $|v_i, J_i, M_i\rangle$ as the i-th eigenstate, the constraints of the selection rules mandate taking a superposition involving states where $J_2 = J_1$ or $J_2 = J_1 \pm 2$. Here $v_i$ and $J_i$ are the vibrational and rotational quantum numbers respectively and $M_i$ is the component of $J_i$ along the direction of polarization of the external field. A linearly polarized pump laser is used to achieve the allowed coefficient $|c_2|^2 \leq 0.2$.

As an example, Table 2 below lists the values of $E_L$ needed to achieve different values of $|c_2|^2$ for superpositions of the ground electronic state between $|v=0, J=0, M=0\rangle$ and $|v=0, J=2, M=0\rangle$, where a realistic value of $\gamma = 1.0 \times 10^9$ Hz is assumed for $N_2$ molecules, and negligible detuning is assumed, i.e. $\Delta_{2\omega L} << \gamma$.

TABLE 2

| $|c_2|^2$ | $E_L$ (V/m) | $I_L$ (W/cm$^2$) |
|---|---|---|
| 0.20 | $1.1 \times 10^8$ | $6.42 \times 10^9$ |
| 0.10 | $9.3 \times 10^7$ | $4.59 \times 10^9$ |
| 0.01 | $6.3 \times 10^7$ | $2.11 \times 10^9$ |
| 0.001 | $2.9 \times 10^7$ | $1.54 \times 10^9$ |

As a further example, Table 3, shows the value of the pump field $E_L$ and the intensity $I_L$ and $\omega_L$ required for different superpositions of the ground electronic state between $|v_1, J=0, M=0\rangle$ and $|v_2, J=2, M=0\rangle$, where as before, $\gamma = 1.0 \times 10^9$ Hz, and $|c_2|^2 = 0.2$, and negligible detuning are assumed.

TABLE 3

| $v_1$ | $v_2$ | $E_L$ (V/m) | $I_L$ (W/cm$^2$) | $\omega_L$ (Hz) |
|---|---|---|---|---|
| 0 | 1 | $4.6 \times 10^8$ | $9.18 \times 10^{10}$ | $2.1988 \times 10^{14}$ |
| 0 | 2 | $4.72 \times 10^8$ | $1.18 \times 10^{11}$ | $4.3673 \times 10^{14}$ |
| 0 | 3 | $4.74 \times 10^8$ | $1.19 \times 10^{11}$ | $6.5077 \times 10^{14}$ |
| 0 | 4 | $7.5 \times 10^8$ | $2.98 \times 10^{11}$ | $8.6241 \times 10^{14}$ |

The beam downstream of the skimmer is assumed to have a Gaussian transverse speed distribution, $$f(v_\perp) = n \frac{1}{\sqrt{\pi}\sigma_{v_\perp}} e^{\frac{-(v_\perp - \bar{v}_\perp)^2}{\sigma_{v_\perp}^2}},$$

where n is the number of particles used for stimulation. The center of the distribution $\bar{v}_\perp$ is zero or very close to zero, and the spread $\sigma_{v_\perp}$ is taken as 30 m/s which is assumed to be a reasonable value for a beam of $N_2$ molecules without undergoing laser cooling. The value for the longitudinal speed $v_\parallel$ of the beam is taken to be 600 m/s. This value can be obtained from the expression $$v_\parallel = \left(\frac{2K\gamma T_0}{M_{buff}(\gamma - 1)}\right)^{1/2},$$

where K is the Boltzmann constant, $M_{buff}$ is the mass of the buffer gas atom used, $\gamma$ is the specific heat ratio of the buffer gas and $T_0$ is the initial temperature. This expression is derived in the book "Atomic and Molecular Beam Methods", edited by G. Scoles, published by Oxford University Press (1998). The effect of aberrations due to the longitudinal speed distributions has been omitted here.

The effect of the optical coherence of the standing waves, and the resulting optical potential, are now considered. The prepared $N_2$ beam is subjected to two standing CW fields, whose intensity is uniform over a distance of $L_{int}$, the length of interaction along $\hat{x}$, but is zero elsewhere. A free flight distance $L_{ff}$ can also be introduced between the field and the surface to observe its effect on the deposition.

The wave vectors of the two standing waves (SW) are $$|k_1|\hat{z} = \frac{2\pi}{\lambda_1}\hat{z} \text{ and } |k_2|\hat{z} = \frac{2\pi}{\lambda_2}\hat{z},$$

where $\lambda_1$ and $\lambda_2$ are the optical wave length of the two standing waves and $\hat{z}$ is the unit vector along the propagation direction. The combined SW field is of the form $$E(z,t) = [2E_1^{(0)}\cos(k_1 z)e^{i\omega_1 t} + c.c.] + [2E_2^{(0)}\cos(k_2 z + \theta_F)e^{i\omega_2 t} + c.c.] \quad (5)$$
$$\equiv [E(w_1) + c.c.] + [E(w_2) + c.c.]$$

where c.c. denotes the complex conjugate of the terms preceeding it, $\theta_F$ is the relative phase of the two SW, $E_1^{(0)}$ and $E_2^{(0)}$ are given by $$E_1^{(0)} = \left(\frac{2I_1\mu_0}{c}\right)^{1/2} \text{ and } E_2^{(0)} = \left(\frac{2I_2\mu_0}{c}\right)^{1/2}$$

respectively with c, $\mu_0$ and $I_i$ being the speed of the light, permeability of the vacuum and the intensity of the i-th SW field. The phase $\theta_F$ changes the position of the nodes and antinodes of $E(z,t)$ along z and affects the position of the minima in the SW-induced OP. Choosing $$w_2 - w_1 = \Omega_{21} = \frac{E_2 - E_1}{\hbar},$$

so that excitation of $|\phi_1\rangle$ by $\omega_1$ and of $|\phi_2\rangle$ by $\omega_2$ lead to the same energy $E = E_1 + \hbar\omega_1 = E_2 + \hbar\omega_2$.

The interaction between the molecule and incident field is given by $(-\mu \cdot E)$, where, within first order perturbation theory and neglecting state line widths, the dipole moment can be obtained as:

$$\mu = \mu(w_1) + \mu(-w_1) + \mu(w_2) + \mu(-w_2) + \mu(w_{21} + w_1) + \quad (6)$$
$$\mu(-w_{21} - w_1) + \mu(w_{21} - w_2) + \mu(-w_{21} + w_2)$$
$$= \chi^{in}(w_1)E(w_1) + \chi^{ni}(w_1)E(w_1) + \chi^{in}(w_2)E(w_2) +$$
$$\chi^{ni}(w_2)E(w_2) + \chi^{in}(w_{21} + w_1)E'(w_{21} + w_1) +$$
$$\chi^{in}(w_{21} - w_2)E'(w_{21} - w_2) + c.c.$$

where $E(\omega_i)$ are defined above, $E'(\omega_{21}+\omega_1) = E_1^{(0)}\cos(k_1 z)\exp[(\omega_{21}+\omega_1)t]$, and $E'(\omega_{21}-\omega_2) = E_2^{(0)}\cos(k_2 z + \theta F)\exp[(\omega_{21}-\omega_2)t]$, and $\mu(-\omega) = \mu(\omega)^*$. The susceptibilities $\chi$ above are given by $$\chi^{in}(w_1) = \frac{1}{\hbar}\sum c_1 c_2^* \left[\frac{\mu_{j1}\mu_{2j}}{w_{j1} + w_2} + \frac{\mu_{j2}\mu_{1j}}{w_{j2} - w_2}\right]\frac{E_2^{(0)}}{E_1^{(0)}}$$

$$\chi^{in}(w_2) = \frac{1}{\hbar}\sum c_2 c_1^* \left[\frac{\mu_{j2}\mu_{1j}}{w_{j2} + w_1} + \frac{\mu_{j1}\mu_{2j}}{w_{j1} - w_1}\right]\frac{E_1^{(0)}}{E_2^{(0)}}$$

$$\chi^{ni}(w_1) = \frac{1}{\hbar}\sum |c_1|^2 \mu_{j1}\mu_{1j}\left[\frac{1}{w_{j1} + w_1} + \frac{1}{w_{j1} - w_1}\right] +$$
$$\frac{1}{\hbar}\sum |c_2|^2 \mu_{j2}\mu_{2j}\left[\frac{1}{w_{j2} + w_1} + \frac{1}{w_{j2} - w_1}\right]$$

$$\chi^{ni}(w_2) = \frac{1}{\hbar}\sum |c_1|^2 \mu_{j1}\mu_{1j}\left[\frac{1}{w_{j1} + w_2} + \frac{1}{w_{j1} - w_2}\right] +$$
$$\frac{1}{\hbar}\sum |c_2|^2 \mu_{j2}\mu_{2j}\left[\frac{1}{w_{j2} + w_2} + \frac{1}{w_{j2} - w_2}\right]$$

$$\chi^{in}(w_{21} + w_1) = \frac{1}{\hbar}\sum c_2 c_1^*\left[\frac{\mu_{j1}\mu_{2j}}{w_{j1} + w_1} + \frac{\mu_{j2}\mu_{1j}}{w_{j2} - w_1}\right]$$

$$\chi^{in}(w_{21} - w_2) = \frac{1}{\hbar}\sum c_1 c_2^*\left[\frac{\mu_{j1}\mu_{2j}}{w_{j1} - w_2} + \frac{\mu_{j2}\mu_{1j}}{w_{j2} + w_2}\right]$$

where $\omega_{mn} = (E_m - E_n)/\hbar$, $\mu_{ij} = \langle\phi_i|\mu\cdot\hat{n}|\phi_j\rangle$, $\hat{n}$ being the unit vector along the direction of polarization of the external field. Since both the SW are linearly polarized along the z axis (Eq.(6)) only the zz component of the polarizability, denoted $\chi_{zz}$, need be considered. Here the superscripts "in" and "ni" refer to the interference and non-interference terms respectively of $\chi$, where the interference terms are the direct consequence of the coherent superposition of the $|\phi_1\rangle$ and $|\phi_2\rangle$ state. Control over $\chi(\omega_i)$ is obtained by changing various parameters, e.g., $$\left|\frac{E_2^{(0)}}{E_1^{(0)}}\right|,$$

$|c_1|, |c_2|, \theta_M$ and $\theta_F$, where $\theta_M$ is the relative phase of $c_1$ and $c_2$.

The nonlinear dipole optical potential experienced by molecules in the $N_2$ molecular beam motion is $$V_{op} = -\mu \cdot E = -\sum_{i=1,2;j=1,2;l=+,-;m+,-} V_{ijlm} \quad (7)$$

where $V_{ijlm} = \mu(l\omega_i)E(m\omega_j)$. Here the components of dipole moment (Eq.(6)) other than those at frequencies $\omega_1$ and $\omega_2$ are ignored. Note that there are three types of terms in Eq.(7): (1) i=j, l≠m where Eq.(7) has only time independent parts, (2) l=m where Eq.(7) has terms which oscillate faster than $\omega_1$ or $\omega_2$ and (3) i≠j, l≠m where Eq.(7) has terms which oscillate slower than either $\omega_1$ or $\omega_2$. Adopting the rotating wave approximation (RWA) results in the exclusion of terms corresponding to case (2). The final expression for the optical potential is then $$V_{op} = -2[\Re(V_{11+-}) + \Re(V_{22+-}) + \Re(V_{12+-}) + \Re(V_{21+-})] = V_{op}^{ni} + V_{op}^{in} \quad (8)$$

where $\Re$ denotes the real part and $$-V_{op}^{ni} = 2\Big[4E_1^{(0)2}\cos^2(k_1 z)\chi^{ni}(w_1) + 4E_2^{(0)2}\cos^2(k_2 z + \theta_F)\chi^{ni}(w_2) + \quad (9)$$
$$4E_1^{(0)}E_2^{(0)}\cos(k_1 z)\cos(k_2 z + \theta_F)\chi^{ni}(w_1)\cos(w_1 - w_2)t +$$
$$4E_1^{(0)}E_2^{(0)}\cos(k_1 z)\cos(k_2 z + \theta_F)\chi^{ni}(w_2)\cos(w_2 - w_1)t\Big]$$

$$-V_{op}^{in} = \quad (10)$$
$$2\Big[4E_1^{(0)2}\cos(k_1 z)\cos(k_2 z + \theta_F)\chi_r^{in}(w_1) + 4E_2^{(0)2}\cos(k_1 z)\cos(k_2 z + \theta_F)$$
$$\chi_r^{in}(w_2) + 4E_1^{(0)}E_2^{(0)}\cos^2(k_2 z + \theta_F)[\chi_r^{in}(w_1)\cos(w_1 - w_2)t -$$
$$\chi_I^{in}(w_1)\sin(w_1 - w_2)t] + 4E_1^{(0)}E_2^{(0)}$$
$$\cos^2(k_1 z)[\chi_r^{in}(w_2)\cos(w_2 - w_1)t - \chi_I^{in}(w_2)\sin(w_2 - w_1)t]\Big]$$

Here $\chi_r$ denotes the real part, and $\chi_I$ denotes the imaginary part of the susceptibility.

Numerical experiments show that the time-dependent parts in Eqs.(9) and (10) can be neglected; they are found not to cause any significant change in the trajectory. Therefore, $$V_{op}^{ni} = -[8E_1^{(0)2} \cos^2(k_1 z)\chi_r^{ni}(\omega_1) + 8E_2^{(0)2} \cos^2(k_2 z + \theta_F)\chi_r^{ni}(\omega_2)] \quad (11)$$

$$V_{op}^{in} = -[8E_1^{(0)2} \cos(k_1 z)\cos(k_2 z + \theta_F)\chi_r^{in}(\omega_1) + 8E_2^{(0)2} \cos(k_1 z)\cos(k_2 z + \theta_F)\chi_r^{in}(\omega_2)] \quad (12)$$

Thus, the optical potential in the absence of molecular coherence consists of two terms each representing the dipole interaction of the field and the induced molecular dipole of the same frequency.

Figure 2:
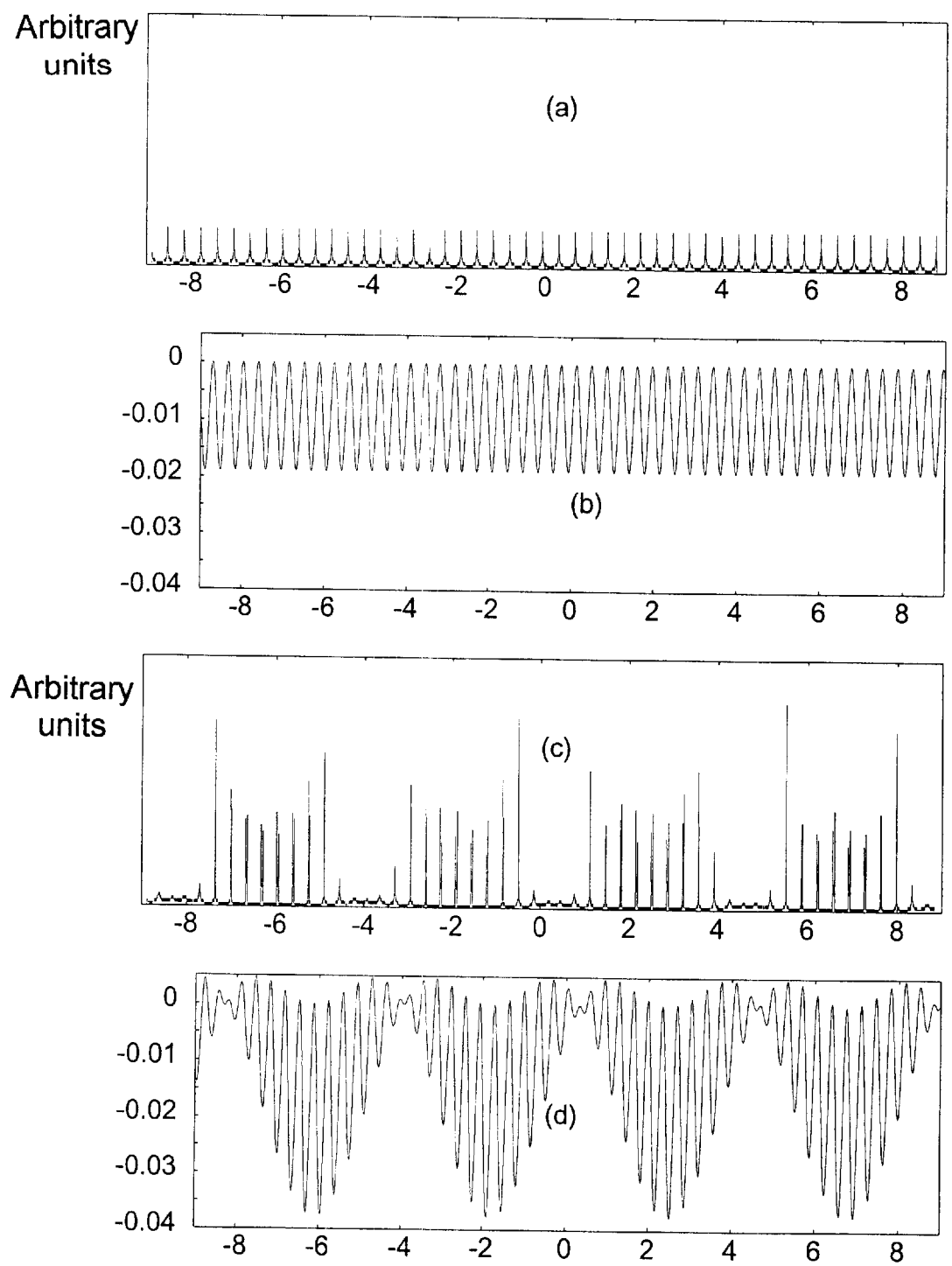
FIGS. 2(a), 2(b), 2(c) and 2(d) show how the density distribution of deposition of molecules and the optical potential vary along the z-direction, both in the presence of and in the absence of molecular coherence.
Figure 3:
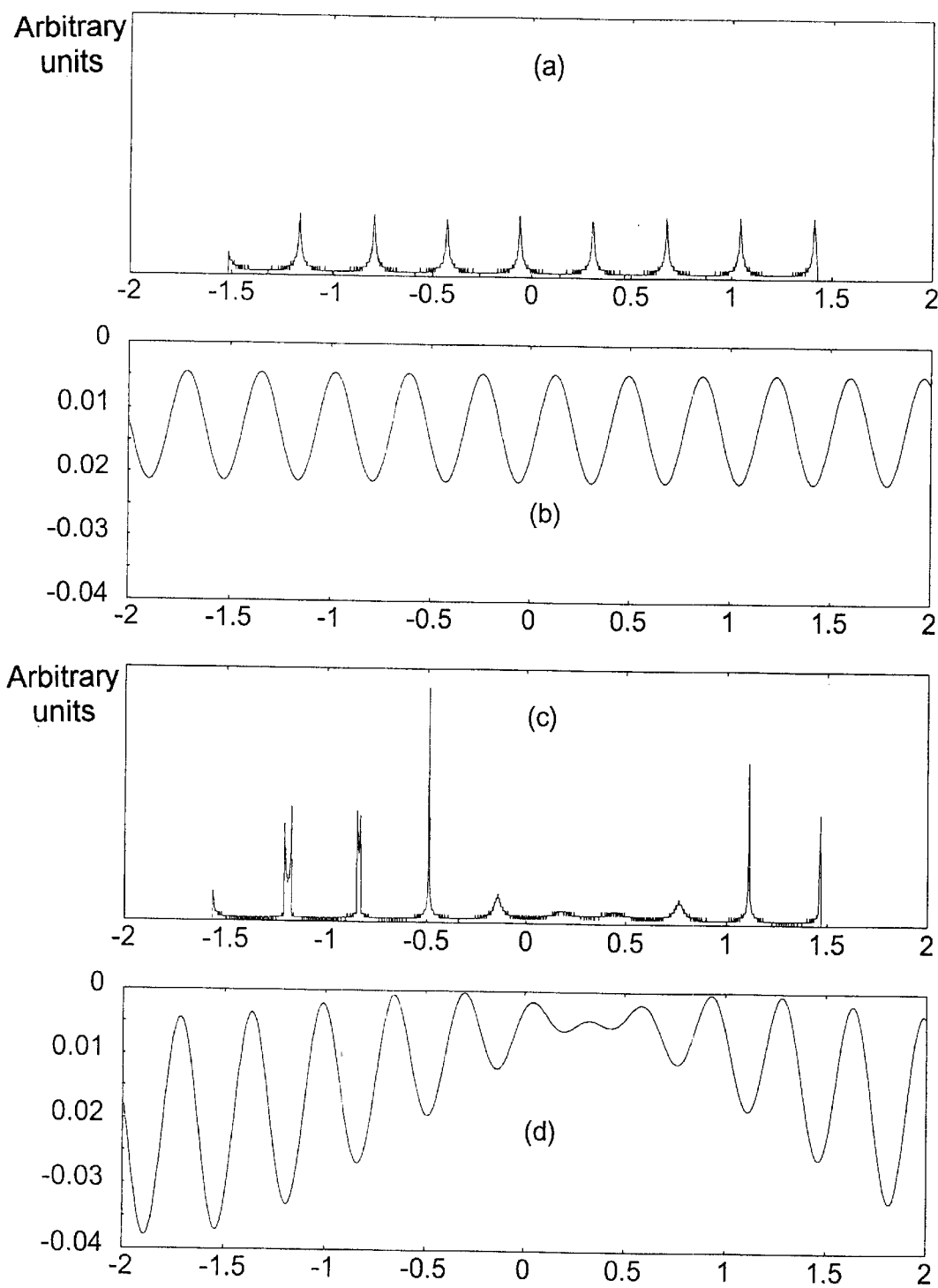
FIGS. 3(a), 3(b), 3(c) and 3(d) are plotted under the same conditions as FIGS. 2(a) to 2(d), but show an enlarged section in the z-direction.

Thus, the molecules experience the above optical potential, which is an oscillating function along the z direction and which acts as an array of lenses. Each minimum of the potential behaves as a focusing center and each maximum behaves as a defocusing center. The results is an inhomogeneous aperiodic distribution of potential minima whose depths vary, depending on z, $E_1^{(0)}$, $E_2^{(0)}$, $|c_1|$, $|c_2|$, $\theta_M$ and $\theta_F$. Reference is now made to FIGS. 2 and 3 (to be discussed in detail hereinbelow), which show typical results of the molecular density distribution obtained along the z-direction, together with the corresponding optical potential. It is seen that $V_{op}^{ni}$ represents a periodic array of lenses, whereas $V_{op} = V_{op}^{ni} + V_{op}^{in}$ does not. Thus, unlike atomic lithography where the optical potential is purely periodic, different optical potentials can be obtained by altering terms in the potential which enter via quantum interference. This feature of the present invention enables pattern formation not realized in prior art conventional atomic lithographic techniques.

The classical density distribution of molecules on the substrate is now calculated. For an initial uniform spatial distribution of molecules at the skimmer $\rho(z, 0)$=constant, the classical trajectories can be calculated for every molecule interacting with the optical potential given by Eq.(8) to obtain the spatial distribution of molecule $\rho(z, T)$ at time $$T = T_{int} + \frac{L_{ff}}{v_{\parallel}},$$

where $T_{int}$ is the actual interaction interaction time between the molecules and the optical potential, and is equal to $L_{int}/v_{\parallel}$.

The numerical steps in the computation for this molecular density distribution after interacting with the SW-induced OP are as follows:

Step 1: At t=0, consider a fixed number of molecules (n=20,000 in the example shown) uniformly distributed over a small portion of the skimmer $-\alpha\lambda_2 \leq z^{(N)} \leq \alpha\lambda_2$, where $\alpha$=2 in the example shown Step 2: Divide this range of $z^{(N)}$ into $N_1$ discrete points as $z_i^{(N)}$ where i=1, 2 . . . , $N_1$ so that every $$\Delta z^{(N)} = \frac{2\alpha\lambda_2}{(N_1 - 1)}$$

length of the skimmer contains $n_1 = n/N_1$ number of molecules.

Step 3: Fit these $n_1$ molecules into a transverse speed distribution function given by $f(v_\perp)$. This leads to say, $m_i$ molecules having transverse speed $v_{\perp i}$ such that $\Sigma_i m_i = \int f(v_\perp) dv_\perp = n_1$. Every $N_1$ discrete length of size $\Delta z^{(N)}$ has the same distribution.

Step 4: Calculate the force at every point $z_i^{(N)}$, where i=1,2. . . ,$N_1$ and solve the set of equations given by Eqs.(1) and (2) where $p_i$ is given by $m_{N2} v_{\perp i}$. For any i, the same equation with the same $v_{\perp i}$ will be solved $m_i$ times.

Step 5: The final distribution $\mu(z_s, T)$ of the molecule along $z_s$ onto a substrate(s) is obtained by counting the number of particles hitting a particular region along $z_s$ upon their deposition onto a substrate. The length of $z_s$ has been fixed at $4\lambda_2$ for the computational example shown.

The deposition density distribution patterns obtained are functions of the parameters used in performing the coherently controlled optical focusing of the molecular beam. Ideally, every minimum of the Optical Potential OP acts as a focusing center, giving rise after a sufficient time of interaction, to a delta function molecular density distribution, and producing a corresponding pattern on the substrate. The deposition pattern formed, $\rho(z_s, T)$ can be approximated by the expression:

$$\rho(z_s, T) = \sum_m |a(z_s, T)|^2 f(z, T) \delta(z_s - z_m) \quad (13)$$

where $|a(z_s,T)|^2$ is the intensity of focusing at a given point $z_s$ onto the substrate at time T, and f(z,T) may be chosen as a Lorentzian function. The point $z_m$ is the position of a minimum in the optical potential. The width of f(z,T) together with $|a(z_s,T)|^2$ measures the quality of focusing of the molecules, in terms of the intensity and width of the focused beam particle deposits. The focusing quality of the deposition is dependent on a number of parameters, namely, $c_1$, $c_2$, $\theta_F$, $\sigma_{v\perp}$, $|\phi_1\rangle$, $|\phi_2\rangle$, $L_{ff}$, $T_{int}$, $E_1^{(0)}$ and $E_2^{(0)}$. As illustrative of the method of the present invention, the effect of these parameters on the nature of the resulting molecular deposit is now described.

(a) The Effect of Molecular Coherence:

The parameters $c_1$, $c_2$, $\theta_M$, $|\phi_1\rangle$ and $|\phi_2\rangle$ introduced into the OP are the direct consequence of molecular coherence. As can be seen from the expressions for $V_{op}$ (equations 11 and 12), these parameters do not affect the location of the OP minima. Hence they have no direct effect on changing the position of the deposition onto a substrate. However, they do have a direct effect on the intensity of the deposition resulting from the change in the magnitude of the OP. If there were no molecular coherence, deposition would be due only to $V_{op}^{(ni)}$, i.e., the usual dipolar interaction between the molecule and the coherent electric field.

The effect of molecular coherence on the deposition distribution is shown in FIGS. 2(a) to 2(d), which show how the density distribution of deposition $\rho(z_s,T_{int})$ and the optical potential vary along the A direction, both in the presence of and in the absence of molecular coherence. The scale for the optical potential is graduated in meV, while the distance along the $z_s$ direction is measured in $\mu$m. The results shown in FIGS. 2(a) to 2(d) are calculated using 20,000 molecular trajectories, and under the conditions:

$\sigma_{v\perp}$=30 m/sec, $E_2^{(0)}$=1.0×10$^6$ V/cm, $E_2^{(0)}/E_1^{(0)}$=1.0×10$^4$, $\theta_F$=−2.65 rad, $T_{int}$=0.625 sec, $\lambda_1$=0.628 $\mu$m, $\lambda_2$=0.736 $\mu$m and $L_{ff}$=0.

The superposition is created between the $|000\rangle$ and $|020\rangle$ states.

FIGS. 2(a) and 2(b) show the effects of the absence of molecular coherence. FIG. 2(a) shows the molecular density distribution and FIG. 2(b) shows the corresponding optical potential. The dipole force due to the non-interference term is exerted primarily along the gradient of the light intensity of the field with frequency $\omega_2$ since $E_2 \gg E_1$. This results in a force acting on the molecules in the direction of the minima of the intensity of the light field with frequency $\omega_2$, i.e., toward the nodes of the standing wave. This is the standard result realized in the atomic beam manipulation techniques known in the prior art, where deposition forms at the nodes of the SW.

If, however, the full optical potential $V_{op}$ is applied, as given by the sum $V_{op}^{(ni)}+V_{op}^{(in)}$, the distribution of the focusing centers changes significantly. FIGS. 2(c) and 2(d) show the density distribution and optical potential for the same conditions as in FIGS. 2(a) and 2(b), but including the effects of molecular coherence. A rather irregular deposition is obtained, with peaks of different intensities, some significantly stronger than others. For the value $T_{int}=0.625$ μsec used in the example shown in plotting FIGS. 2(a) to (d), the weaker spots appear at intervals of approximately $0.5\lambda_2$, with the brighter spots appearing at larger intervals. By contrast, without molecular coherence, as is seen from FIG. 2(a), there is a uniform array of deposition peaks of lower intensity than the maximum peaks obtained with molecular coherence, appearing at a regular interval of $0.5\lambda_2$.

FIGS. 3(a) to 3(d) are plotted under the same conditions as FIGS. 2(a) to 2(d), but show an enlarged section in the z, direction, to better illustrate the differences between the bright and weak deposition spots.

Figure 4:
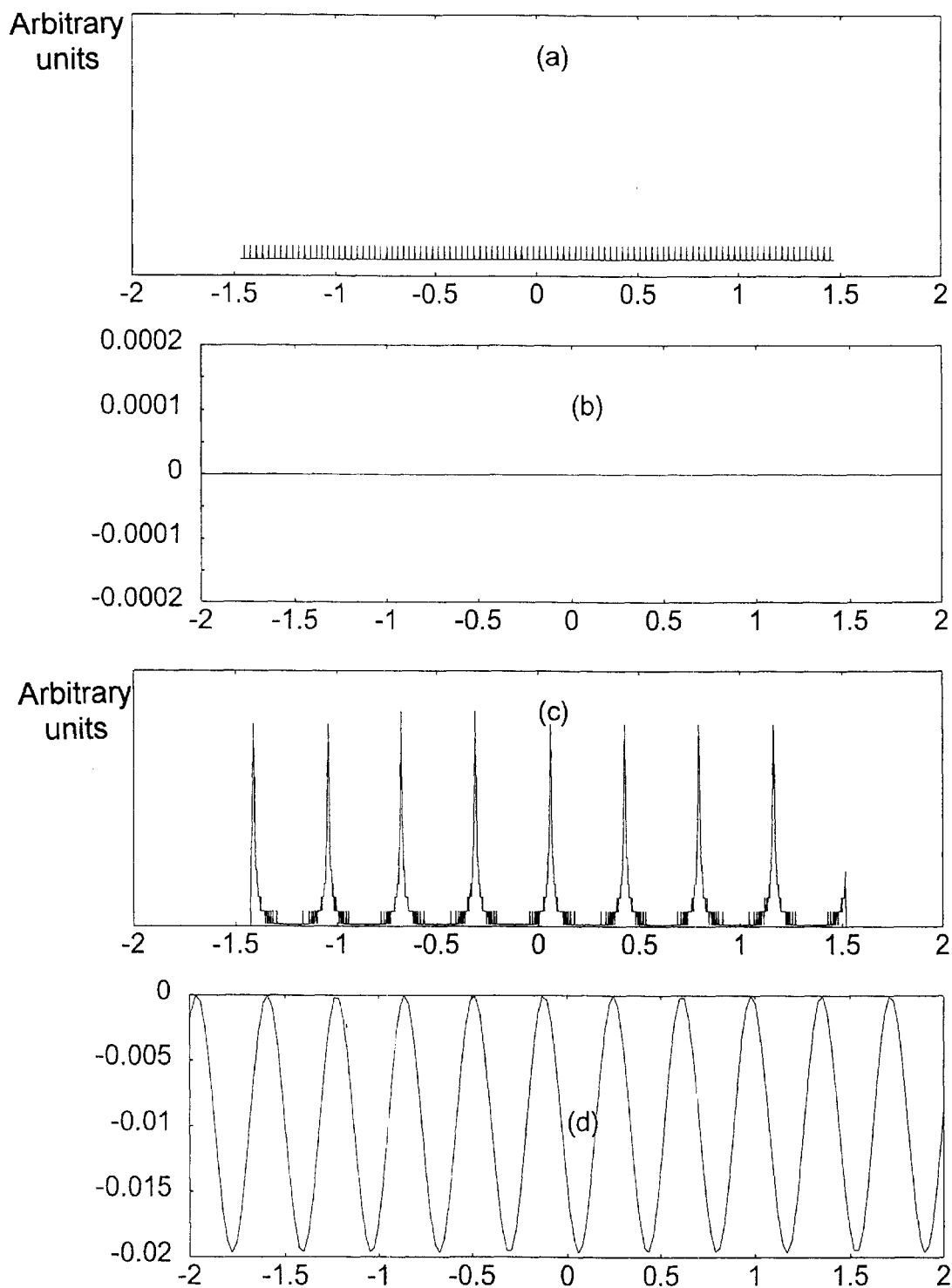
FIGS. 4(a), 4(b), 4(c) and 4(d) show the separate contributions to the molecular density as a function of z, due to the first and second SW fields, taking into account only the non-interference term of the optical potential.
Figure 5:
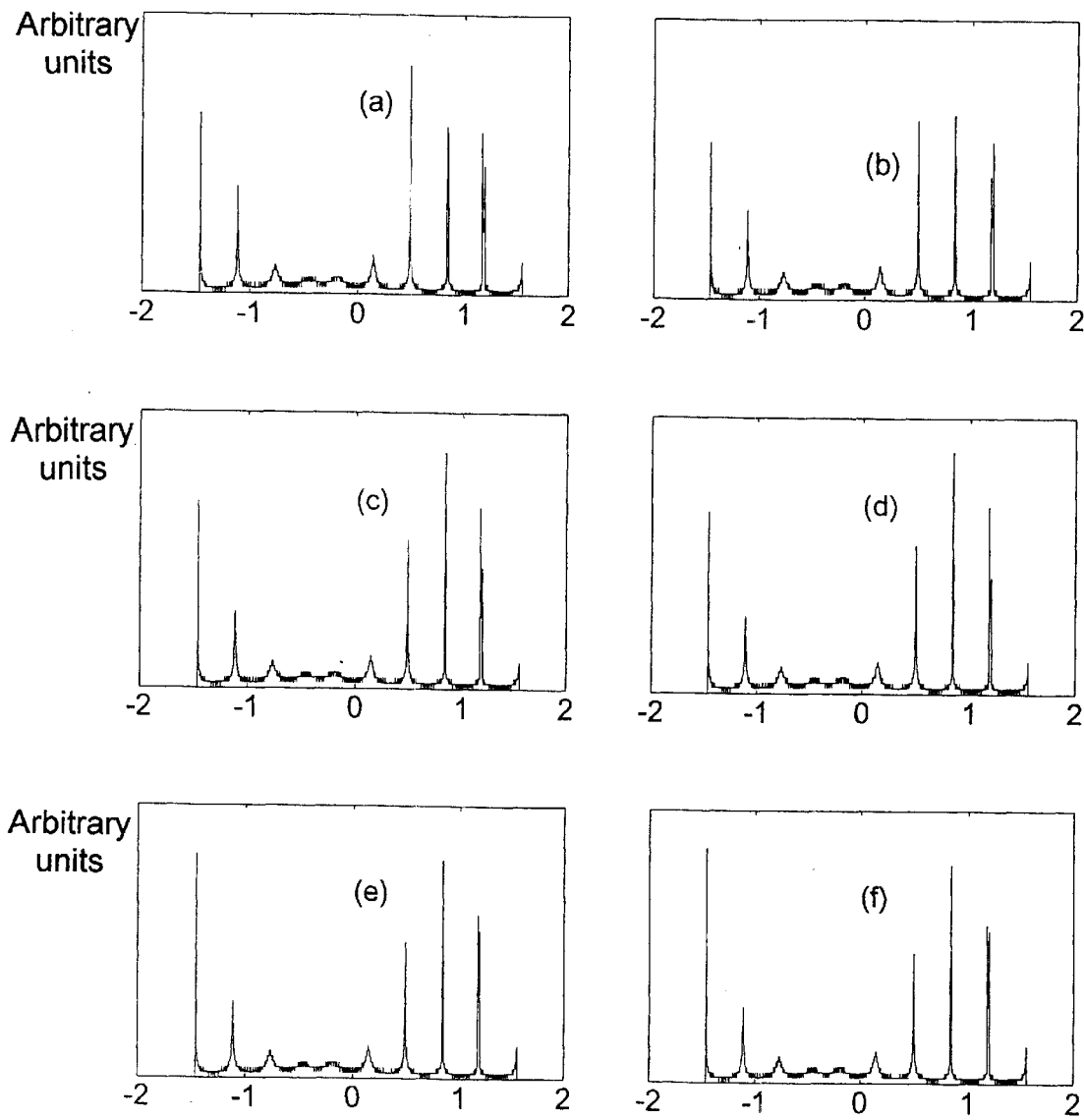
FIGS. 5(a), 5(b), 5(c), 5(d), 5(e) and 5(f) show the dependence of the deposition density on different superpositions of states, using the superposition (|000>+|v00>), where v takes the values 1 to 6.
Figure 6:
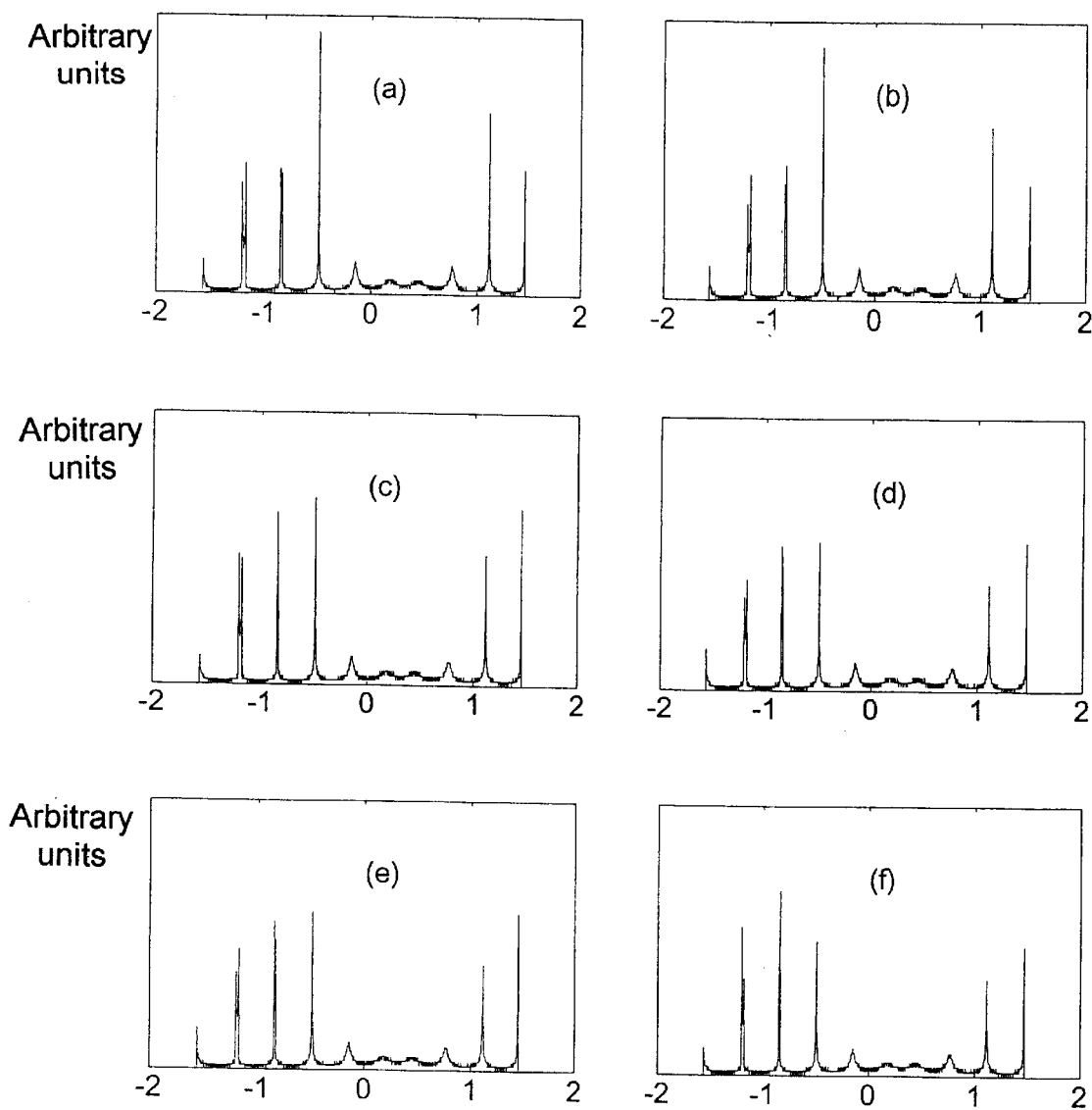
FIGS. 6(a), 6(b), 6(c), 6(d), 6(e) and 6(f) show the dependence of the deposition density on different superpositions of states, using the superposition (|000>+|v20>), where v takes values of 0 to 5.
Figure 7:
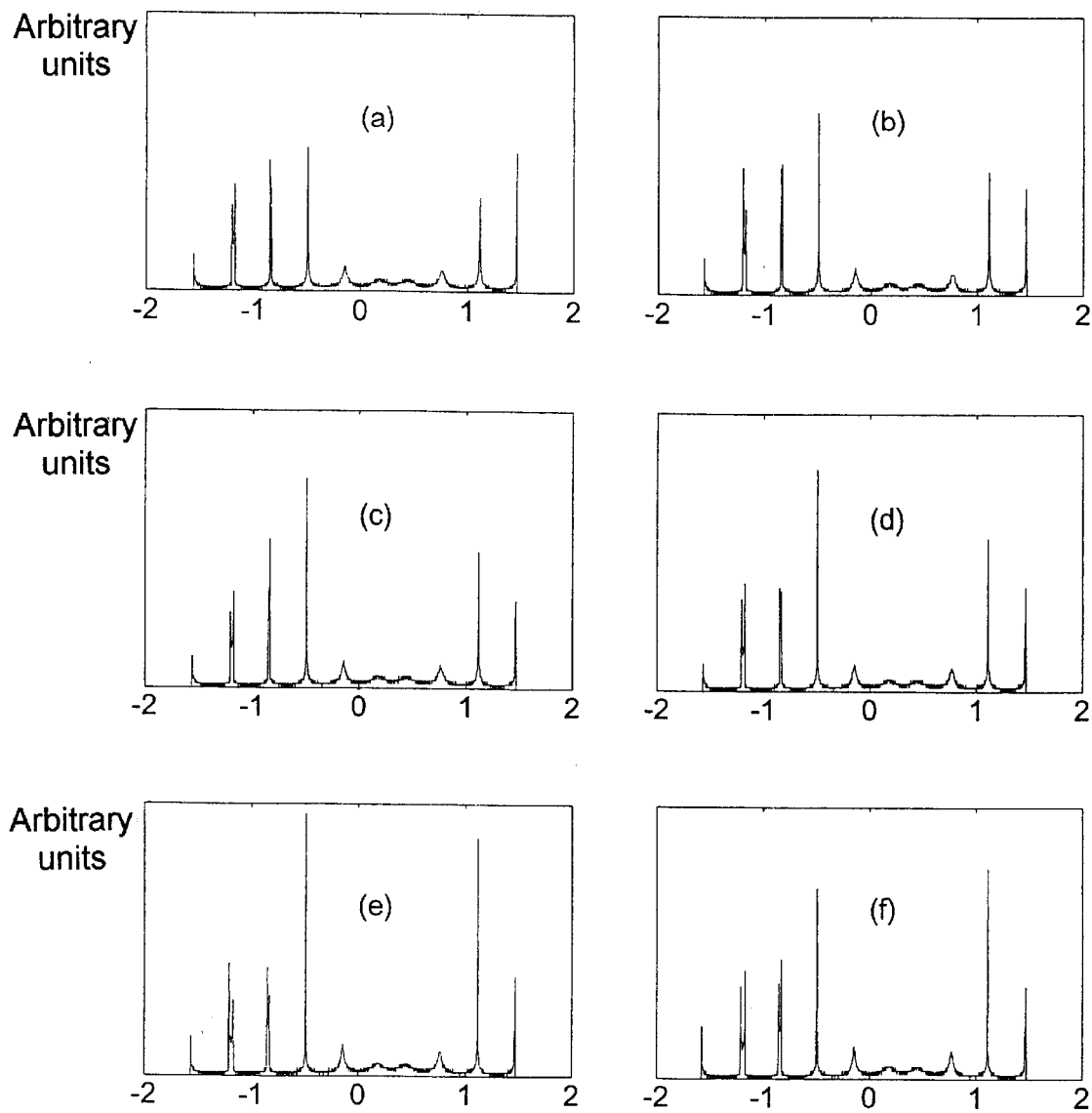
FIGS. 7(a), 7(b), 7(c), 7(d), 7(e) and 7(f) show the dependence of the deposition density on $|c_2|^2$ for six different values of $|c_2|^2$, for the superposition between the |000>and |020> states.
Figure 8:
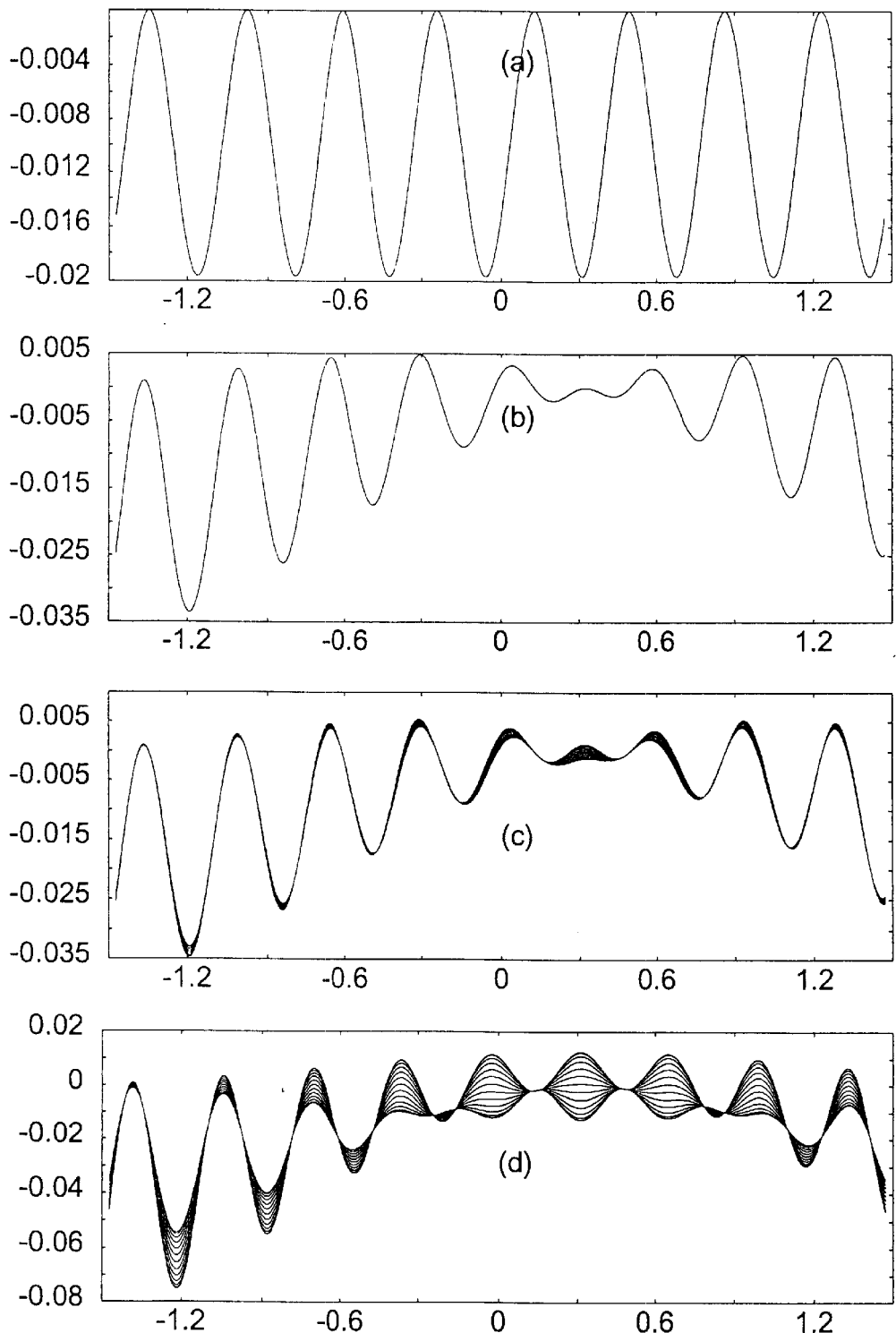
FIGS. 8(a), 8(b), 8(c) and 8(d) show plots of the optical potential for the superposition between 000> and |020> states, with and without molecular coherence, and for different values of $E_2^{(0)}/E_1^{(0)}$.

Reference is now made to FIGS. 4(a) to 4(d) which show the separate contributions to the molecular density as a function of $z_s$, due to the first and second SW fields, $E_1^{(0)}$ and $E_2^{(0)}$, taking into account only the non-interference term $V_{op}^{(ni)}$ of the optical potential. The parameters used for this example are identical to those used for calculating the distributions shown in the various plots of FIGS. 2 and 3. FIG. 4(a) shows a plot of ρ for the first field, FIG. 4(b) shows the values of $V_{op}^{(ni)}$ for the first field, FIG. 4(c) shows a plot of ρ for the second field, and FIG. 4(d) shows the values of $V_{op}^{(ni)}$ for the second field. It is observed that since $E_2>>E_1$, the contribution of the SW field of frequency $\omega_1$ is small compared with that of $\omega_2$. It should also be noted that FIG. 4(c) and FIG. 3(a) are essentially equivalent.

FIGS. 5(a) to 5(f) and FIGS. 6(a) to 6(f) show the dependence of $\rho(z_s,T_{int})$ on different superpositions of states. FIGS. 5(a) to 5(f) show the results using the superposition (|000>+|v00>), where v takes the values 1 to 6 for FIGS. 5(a) to 5(f) respectively, while FIGS. 6(a) to 6(f) show the results using the superposition (|000>+|v20>), where v takes values of 0 to 5 for FIGS. 6(a) to 6(f) respectively. In the calculations used for plotting all parts of FIGS. 5 and 6, the values $\gamma=1\times10^9$ Hz and $|c_2|^2=0.2$ are assumed, and the other parameters used are identical to those used in FIGS. 2 to 4, except that in FIG. 5, $\theta_F=2.65$ rad.

FIGS. 7(a) to 7(f) show the dependence of $\rho(z_s,T_{int})$ on $|c_2|^2$ for six different values of $|c_2|^2$. For FIG. 7(a), $|c_2|^2=0.01$, for (b) 0.1, for (c) 0.15, for (d) 0.2, for (e) 0.4 and for (f) 0.5. The superposition used is between the |000> and |020> states, and all of the parameters used, with the exception of the variable $|c_2|^2$, are those used in FIG. 6. Clearly, the structure of the deposition distribution changes with changing $|c_2|^2$.

Reference is now made to FIGS. 8(a) to 8(d), which show calculated plots of the optical potential corresponding to the parameters $E_2^{(0)}=1.0\times10^6$ V/cm, $\theta_F=-2.65$ rad, $\lambda_1=0.628$ μm, $\lambda_2=0.736$ μm, $\gamma=1\times10^9$ Hz and $|c_2|^2=0.2$, and for the superposition between 000> and |020> states. The different plots show the results corresponding to four different cases, namely: (a) without molecular coherence and with $E_2^{(0)}/E_1^{(0)}=1.0\times10^4$, (b) with molecular coherence and $E_2^{(0)}/E_1^{(0)}=1.0\times10^4$, (c) with molecular coherence and $E_2^{(0)}/E_1^{(0)}=10$, and (d) with molecular coherence and $E_2^{(0)}/E_1^{(0)}=1.0$. Plots corresponding to cases (b), (c) and (d) show $V_{op}$ for 50 different values of $\theta_M$. It is observed that change in the phase difference between $c_1$ and $c_2$, i.e. change in the parameter $\theta_M$, does not significantly alter the shape of the optical potential, except for minor changes in the depth of the well. As such, the deposition pattern on the surface cannot be altered significantly by means of changing $\theta_M$.

(b) The Effect of Optical Coherence.

Figure 9:
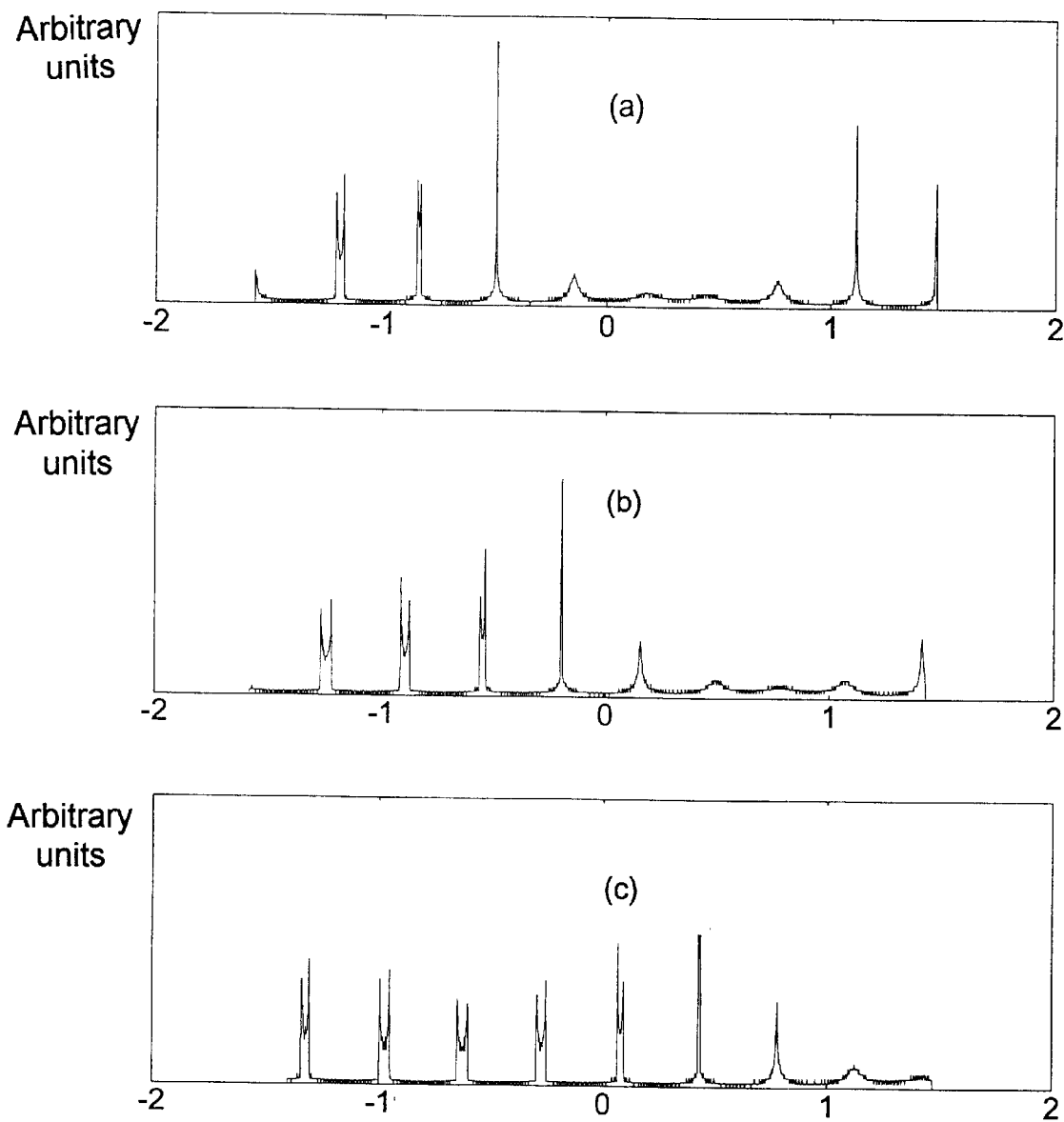
FIGS. 9(a), 9(b) and 9(c) displays the density distribution for three different values of phase between the two standing waves, for the superposition |000>+|020>.
Figure 10:
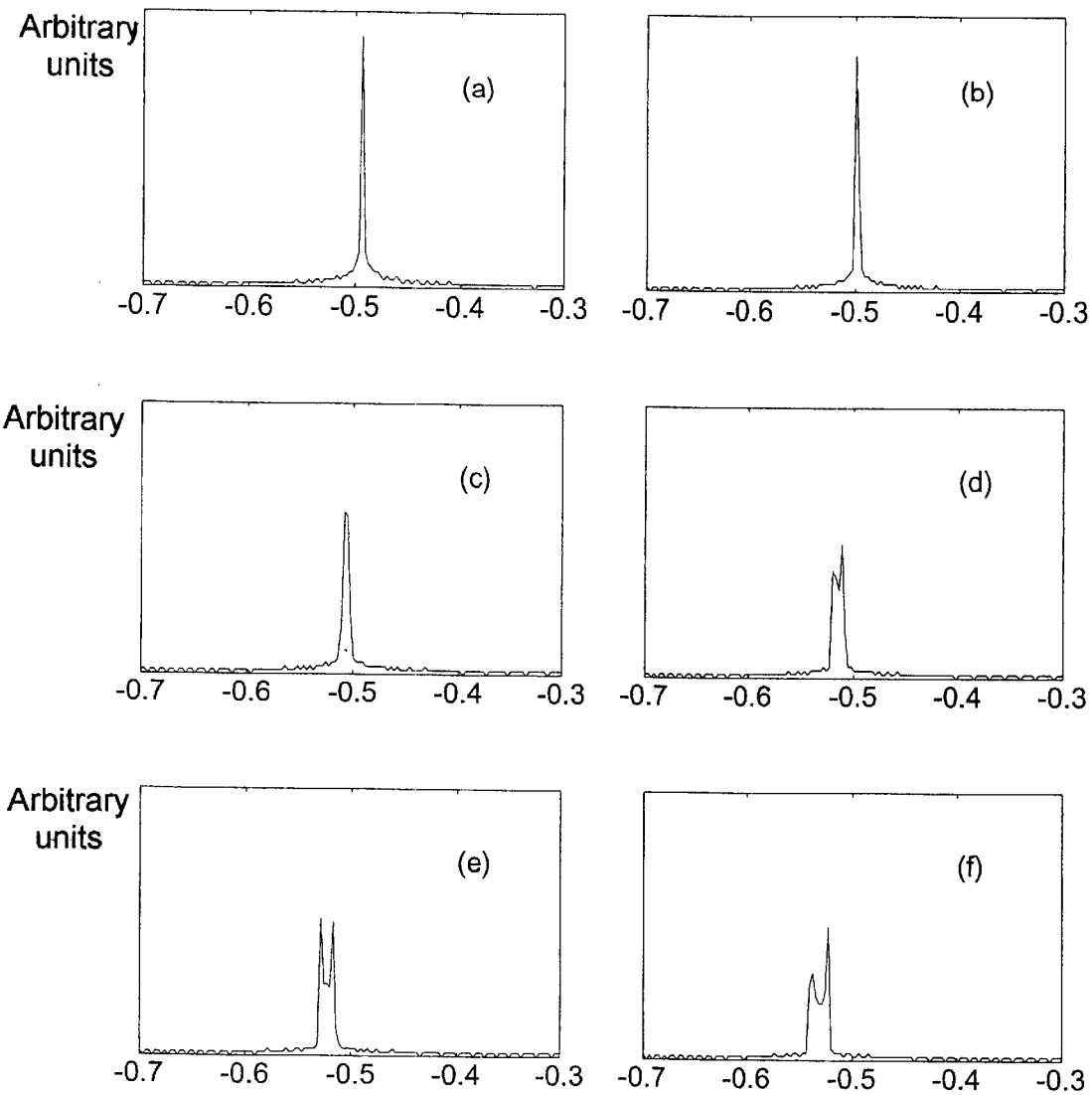
FIGS. 10(a), 10(b), 10(c), 10(d), 10(e) and 10(f) illustrate the variation in the form and intensity of the strongest peak shown in FIG. 9(b) at $z_s$=0.49, as a function of six different values of the relative phase between the two standing waves.
Figure 11:
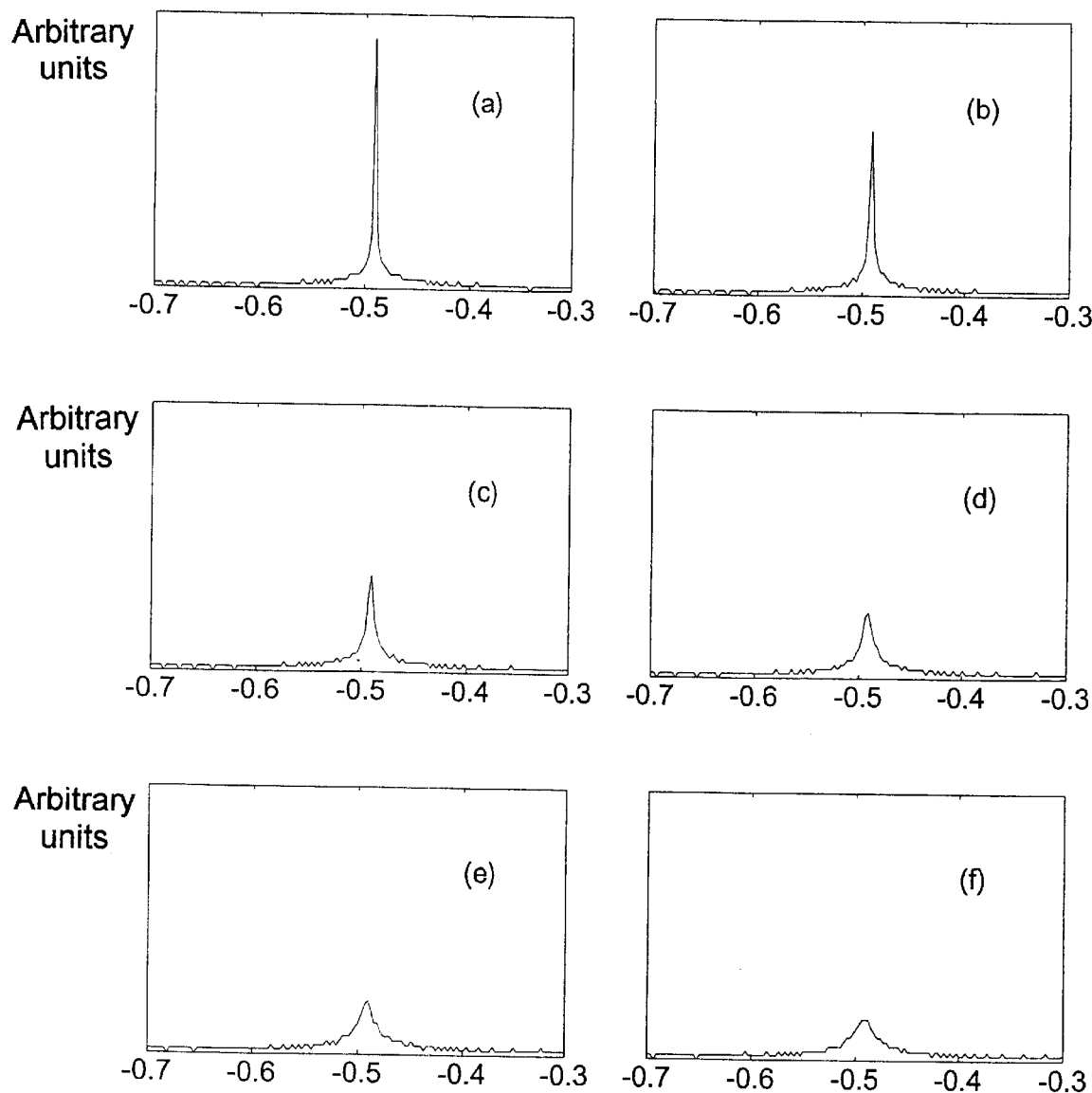
FIGS. 11(a), 11(b), 11(c), 11(d), 11(e) and 11(f) show the variation in the form and intensity of the strongest peak shown in FIG. 9(b), as a function of the intensity of the two SW fields, for six different values of the field of SW2.

FIGS. 9(a) to 9(c) displays the density distribution $\rho(z_s,T_{int})$ obtained for three different values of $\theta_F$, for the superposition |000>+|020>. In FIG. 9(a), $\theta_F=-2.65$ rad, in FIG. 9(b), $\theta_F=-2.0$ rad., and in FIG. 9(c), $\theta_F=-1.0$. The other parameters are those as used in the calculations for the previous relevant figures, such as FIGS. 6(a), 7(a), 8(b), etc. The parameter $\theta_F$ is seen to directly alter the position of the peaks, as well as their width and intensity.

FIGS. 10(a) to 10(f) illustrate the variation in the form and intensity of the strongest peak shown in FIG. 9(a), at $z_s=-0.49$, as a function of the relative phase of the two standing waves. In FIGS. 10(a) to 10(f), the absolute value of $\theta_F$ is set at −2.65, −2.55, −2.45, −2.35, −2.25 and −2.15 radians respectively. It is seen that the sharpest peak in the deposition density is obtained for $\theta_F=-2.65$ rad., and that the peaks become weaker and broader as $\theta_F$ changes from −2.65 to −2.15 radian. In other words, there is an optimum value for $\theta_F$ that results in the most intense and highest resolution peak.

FIGS. 11(a) to 11(f), using similar calculations, show the variation in the form and intensity of the strongest peak shown in FIG. 9(a), as a function of the intensity of the two SW fields. In FIG. 11, the value of $E_2^{(0)}/E_1^{(0)}$ is set at $1.0\times10^4$ and $E_2^{(0)}=$(a) $1.0\times10^6$, (b) $0.97\times10^6$, (c) $0.94\times10^6$, (d) $0.91\times10^6$, (e) $0.88\times10^6$, and (f) $0.85\times10^6$ V/cm. Approximately optimum values of $E_2^{(0)}=1.0\times10^6$ V/cm and $E_2^{(0)}/E_1^{(0)}=1.0\times10^4$ result in a deposition density distribution peak with maximum intensity and minimum width. As is seen from FIGS. 11(b) to 11(f), deviation from these values results in the peak becoming fainter and broader.

(c) Effect of Beam Parameters

The beam parameters, $T_{int}$, $L_{ff}$ and $\sigma_{v\perp}$ also have an effect on the deposition density distribution. This effect is illustrated in the density plots shown in FIGS. 12(a) to 12(c), FIGS. 13(a) to 13(d) and FIGS. 14(a) to 14(d). Since the SW-induced optical potential is comprised of a series of harmonic-type potential wells of varying depth, the time of interaction $T_{int}$ plays a crucial role in determining the nature of the deposition. In general, if $T_{int}$ is longer than the quarter period of oscillation of the molecule in any of the potential wells, sharp peaks will not be formed in the molecular density distribution. Instead the distribution will have large number of smaller peaks. Expressed mathematically, a single sharp peak in the region of the potential minima will be formed only when $T_{int}\sim(2n+1)T/4$, where T is the period of harmonic oscillation for a particular potential well. When $T_{int}\neq(2n+1)T/4$, every peak formed at every potential minima after a time T/4, or (2n+1) multiples of T/4, splits into many weaker peaks.

Figure 12:
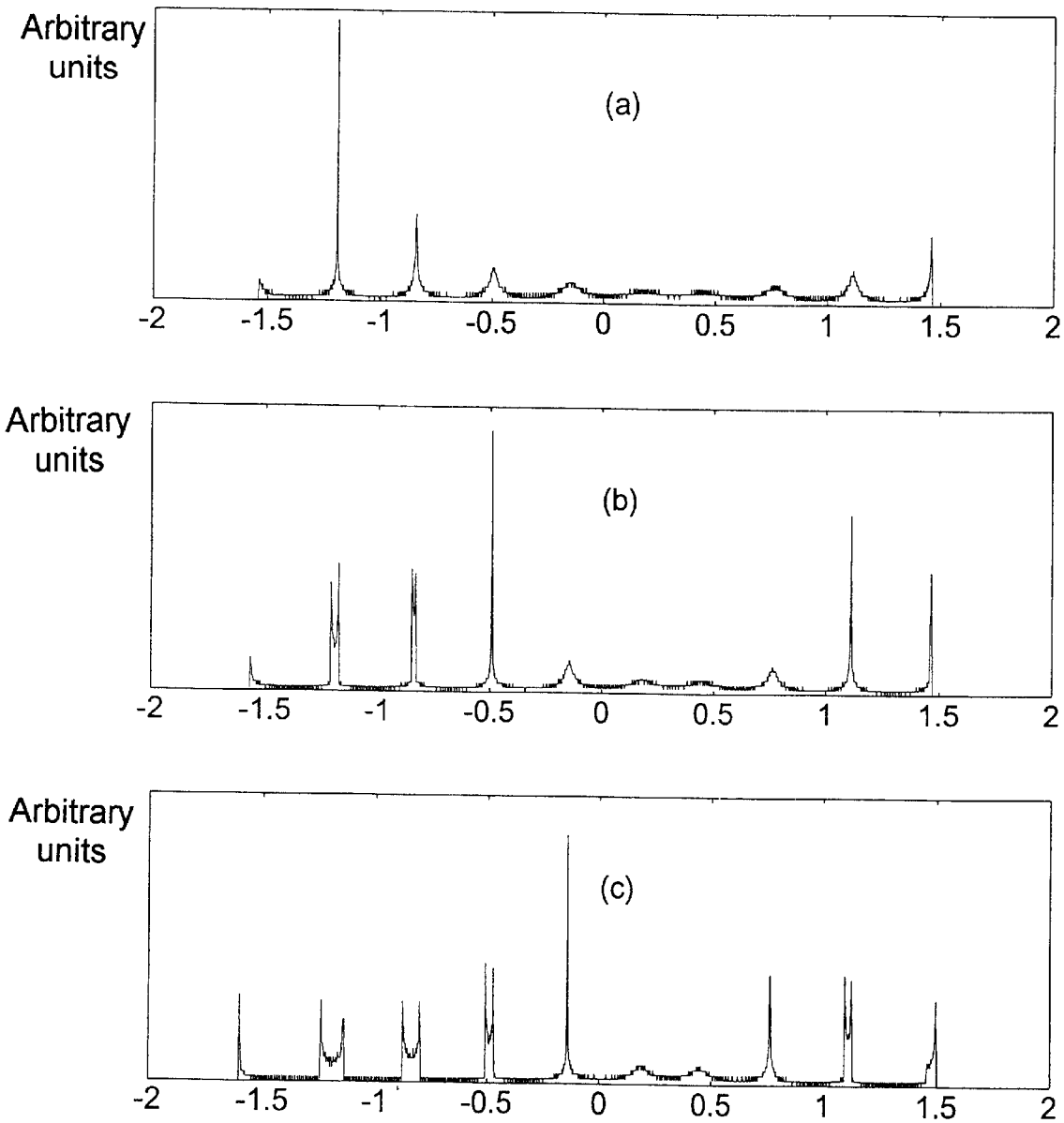
FIGS. 12(a), 12(b) and 12(c) show plots of the density distribution for three different values of the interaction time, $T_{int}$, for the superposition |000>+|020>.

This result can be demonstrated by reference to FIGS. 12(a) to 12(c), which show plots of the spatial values of $\rho(z_s,T_{int})$ obtained for three different values of $T_{int}$, for the superposition |000>+|020>, where $\gamma=1\times10^9$ Hz and $|c_2|^2=0.2$. The values of $T_{int}$ are (a) 0.5 μsec (b) 0.625 μsec, and (c) 0.8 μsec. The other parameters used in calculating the data are $\sigma_{v\perp}=30$ m/sec, $E_2^{(0)}=1.0\times10^6$ V/cm, $E_2^{(0)}/E_1^{(0)}=1.0\times10^4$, $\theta_F=-2.65$ rad, $\lambda_1=0.628$ μm, $\lambda_2=0.736$ μm and $L_{ff}=0$. In accordance with the explanation given above, it is seen that the sharp peak formed for $T_{int}=0.625$ μsec in FIG. 12(b) at $z_s\sim-0.5$ μm, splits into two relatively weak peaks at $T_{int}=0.8$ μsec, as seen in FIG. 12(c). Similarly, for $T_{int}=0.5$ μsec (FIG. 12a), an intense single peak is obtained at $z_s \sim -1.2$ μm, because the time period T corresponding to the potential in the region $z_s \sim -1.21$ μm is such that T/4=0.5 82 sec. Similarly, the most intense peak formed at $T_{int}$=0.625 μsec (FIG. 12b) appears much less intense for $T_{int}$=0.5 μsec (FIG. 12a) because $T_{int}$<T/4. The sharp single peak formed for $T_{int}$=0.51 μsec at $z_s \sim -1.2$ μm implies that the optical potential well at $z_s \sim -1.21$ μm corresponds to the period of oscillation ~0.5/4 μsec for $N_2$.

It is thus observed that the molecular density distribution for different interaction times is a function of the optical potential, and conversely, knowledge of the spatial structure of the deposition density enables information to be obtained about the optical potential.

Figure 13:
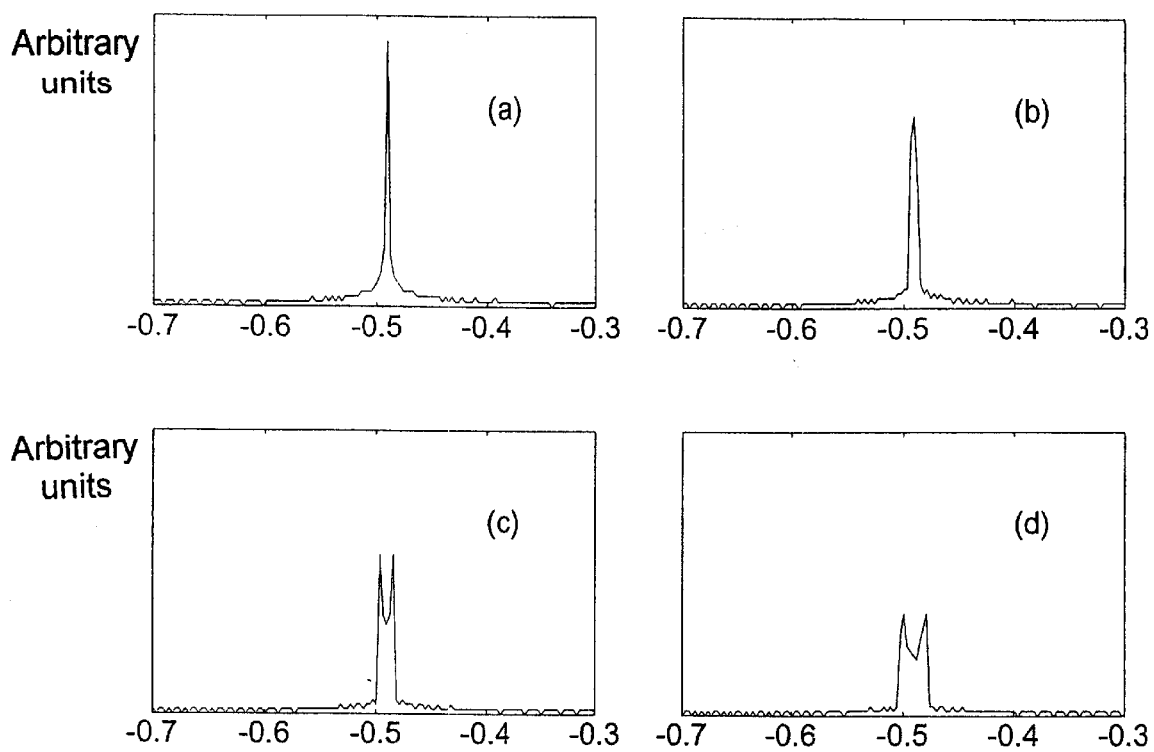
FIGS. 13(a), 13(b), 13(c) and 13(d) show the density distribution of deposition as a function of free flight distance, $L_{ff}$ for four different values of $L_{fp}$.
Figure 14:
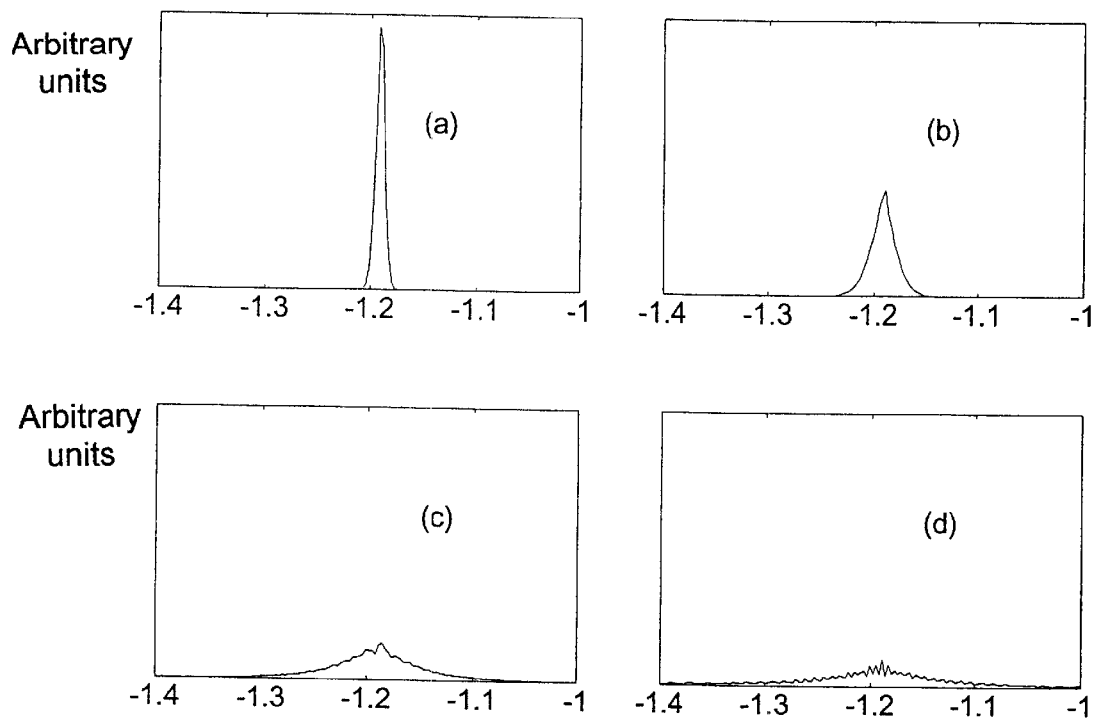
FIGS. 14(a), 14(b), 14(c) and 14(d) show the deposition density distribution as a function of four values of the transverse molecular speed, $\sigma_{v\perp}$.

All of the above results of the application of the present invention are obtained with zero free flight distance, $L_{ff}$=0, between the applied field and the surface onto which the molecules are deposited. The addition of any finite free flight distance leads, for the parameters studied, to a deterioration of the quality of the deposition in terms of its intensity and line width. The density distribution of deposition as a function of free flight distance is shown in FIGS. 13(a) to 13(d). The other deposition parameters for FIGS. 13(a) to 13(d) are the same as those used for the previous examples, such as shown in FIG. 12(b). The values of $L_{ff}$ used in these figures are: FIG. 13(a), $L_{ff}$=0.0; 13(b), $L_{ff}$=25 μm; 13(c), $L_{ff}$=50 μm; and 13(d), $L_{ff}$=75 μm. It is observed that the intensity of the deposition peak decreases rapidly with increase of $L_{ff}$, and the peak itself broadens and splits into lower peaks.

Reference is now made to FIGS. 14(a) to 14(d) which show the effect of the value of $\sigma_{v\perp}$, the transverse molecular speed, on the quality of deposition. It is obvious that as $\sigma_{v\perp}$ decreases the quality of deposition improves significantly. The deposition density distribution is shown for four values of $\sigma_{v\perp}$—(a) 30 m/sec, (b) 60 m/sec, (c) 90 m/sec and (d) 120 m/sec. The other deposition parameters are the same as those used to calculate FIG. 12(a).

Figure 15:
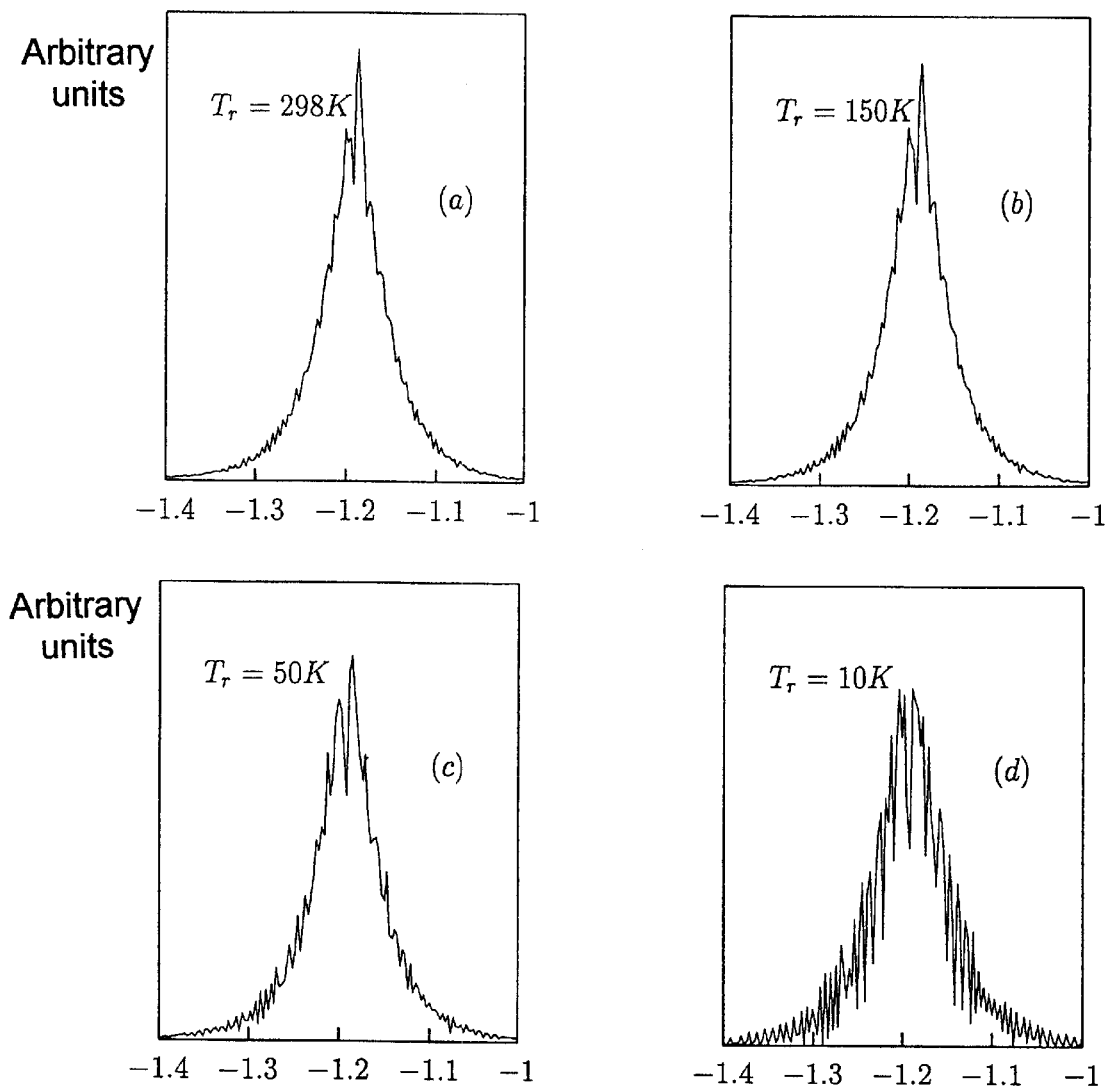
FIGS. 15(a), 15(b), 15(c) and 15(d) show the width of a typical deposited peak as a function of the rotational temperature of the molecules for four different values of $T_r$.

Finally, the effect of the rotational cooling on the quality of the deposition is illustrated in FIGS. 15(a) to 15(d), which show the width of a typical deposited peak as a function of the rotational temperature of the molecules. FIG. 15(a) is shown at a temperature $T_r$ of 298° K., 15(b) at 150° K., 15(c) at 50° K., and 15(d) at 10° K. The graphs show that the deposited peaks becomes wider and more erratic with decrease in the rotational temperature. The effect of rotational cooling is thus opposite to that of the translational cooling.

This invention has been described heretowith in terms of the deposition of molecules as a layer on the surface of a substrate to produce a predetermined pattern of material. According to further preferred embodiments of the present invention, the deposited molecules can be implanted into the surface of a semiconductor substrate, in order to produce selectively doped regions of nanometric resolution according to the predetermined pattern desired. This feature is useful in the production of high resolution semiconductor devices. The molecules used are chosen according to the semiconductor material to be doped, and the type of doping required.

The embodiments enumerated above have been described in terms of molecular coherence arising out of two superposition states, and of focusing arising from the passage of the beam through two standing wave fields. According to further preferred embodiments of the present invention, use can be made of superposition of more than two states, and alternatively or additionally, of focusing by means of more than two standing wave fields. Use of these preferred embodiments provides more degrees of freedom in the choice of the parameters used to control the focusing of the molecular beam, thus allowing more flexibility in the achievement of the specific deposition pattern desired.

It will be appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

We claim:

1. A method of depositing molecules in a predetermined pattern onto a surface comprising the steps of:
   providing a collimated beam of molecules;
   directing said beam through a first electromagnetic field operative to produce a superposition of bound states of said molecules; and
   thereafter directing said beam through a second electromagnetic field, such that said molecules are focused onto said surface in said predetermined pattern.

2. The method according to claim 1 and wherein said superposition of bound states of said molecules is generated by coherent control of energy levels of said molecules.

3. The method according to claim 1 and wherein said second electromagnetic field comprises at least two standing waves.

4. The method according to claim 3 and wherein said standing waves are formed by beams from at least one second laser.

5. The method according to claim 1 and also comprising the step of cooling said beam of molecules before production of said superposition of bound states.

6. The method according to claim 5 and wherein said step of cooling said beam is effected by means of a mechanical cooling process.

7. The method according to claim 6 and wherein said mechanical cooling process is effected by expansion of said beam through a supersonic nozzle.

8. The method according to claim 5 and wherein said step of cooling said beam is effected by means of a laser cooling process.

9. The method according to claim 1 and wherein said first electromagnetic field is formed by at least one first laser beam.

10. The method according to claim 9 and wherein said first laser is a CW laser.

11. The method according to claim 9 and wherein said first laser is a pulsed laser.

12. The method according to claim 1 and wherein said superposition of bound states of said molecules is formed by means of a two-photon absorption process.

13. The method according to claim 1 and wherein said predetermined pattern is aperiodic.

14. The method according to claim 1 and wherein said predetermined pattern is determined at least by the parameters of said first electromagnetic field and by the parameters of said second electromagnetic field.

15. The method according to claim 1 and also comprising the step of directing said beam through a third electromagnetic field, arranged approximately orthogonally to said second electromagnetic field, and in effectively the same common plane, such that said molecules are focused onto said surface in a predetermined array pattern.

16. The method according to claim 1 and wherein said predetermined pattern has a resolution of less than 50 nanometers.

17. A method of depositing molecules in a predetermined pattern onto a surface according to claim 1, wherein said molecules are operative to perform nanolithography.

18. A method of depositing molecules in a predetermined pattern onto a surface according to claim 1, wherein said surface is a storage medium, and said molecules are operative to write information on said storage medium.

19. A method of depositing molecules in a predetermined pattern onto a surface according to claim 1, wherein said molecules in said predetermined pattern constitute a photolithographic mask.

20. A method of depositing molecules in a predetermined pattern onto a surface according to claim 1, wherein said molecules produce doped regions within said surface.

21. A method of depositing molecules in a predetermined pattern onto a surface according to claim 1, wherein said molecules produce a high profile tip structure on said surface.

22. A method of depositing molecules in a predetermined pattern onto a surface according to claim 1, wherein said molecules produce an optical grating structure on said surface.

23. A method of depositing molecules in a predetermined pattern onto a surface according to claim 1, wherein said molecules are operative to perform micro-etching.

* * * * *